(12) United States Patent
Yang

(10) Patent No.: US 12,046,310 B2
(45) Date of Patent: *Jul. 23, 2024

(54) SEMICONDUCTOR DEVICE STRUCTURE

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 183 days.

This patent is subject to a terminal disclaimer.

(21) Appl. No.: 17/859,873

(22) Filed: Jul. 7, 2022

(65) Prior Publication Data

US 2024/0013845 A1 Jan. 11, 2024

(51) Int. Cl.
*G11C 17/16* (2006.01)
*G11C 17/18* (2006.01)
*H10B 20/20* (2023.01)

(52) U.S. Cl.
CPC .............. *G11C 17/16* (2013.01); *G11C 17/18* (2013.01); *H10B 20/20* (2023.02)

(58) Field of Classification Search
CPC ........ G11C 17/16; G11C 17/18; H10B 20/20; H01L 23/5256; H01L 23/5252
USPC ........................................................ 365/200
See application file for complete search history.

(56) References Cited

U.S. PATENT DOCUMENTS 11,587,632 B1 * 2/2023 Yang .................... G11C 29/027
11,729,969 B1 * 8/2023 Liu ......................... G11C 17/18
365/225.7

FOREIGN PATENT DOCUMENTS

TW 202125716 A 7/2021
TW 202147577 A 12/2021

OTHER PUBLICATIONS

U.S. Appl. No. 17/545,471; all pages; filed Dec. 8, 2021 (Year: 2021).*

* cited by examiner

*Primary Examiner* — Fernando Hidalgo
(74) *Attorney, Agent, or Firm* — Muncy, Geissler, Olds & Lowe, P.C.

(57) ABSTRACT

A semiconductor device structure is provided. The semiconductor device structure includes a first gate structure extending along a first direction and electrically connected to a first transistor, a second gate structure extending along the first direction and electrically connected to a second transistor, a first active region extending along a second direction different from the first direction and across the first gate structure and the second gate structure, and a first conductive element extending along the second direction and disposed on the first active region. The first conductive element is electrically connected to the first active region. The first conductive element is electrically connected to the first active region, such that a short circuit between the first active region and the third transistor is formed. The first gate structure and the first active region form a first fuse element, and the second gate structure and the first active region form a second fuse element.

16 Claims, 16 Drawing Sheets

SEMICONDUCTOR DEVICE STRUCTURE

TECHNICAL FIELD

The present disclosure relates to a semiconductor device structure, and more particularly to a semiconductor device structure having fuse elements.

DISCUSSION OF THE BACKGROUND

Fuses and e-fuses are commonly used in memory elements to convert a redundant memory cell to a normal memory cell. A test circuit is utilized to determine the status of the fuse (i.e., whether the fuse is blown), such that the corresponding memory cell can be identified as a normal memory cell or a redundant memory cell. As technology develops, the size of the memory cell of semiconductor device structures decreases. Since the size of each component in a semiconductor device structure cannot be reduced without limit, it is crucial to find other approaches to reduce the size of semiconductor device structures. Meanwhile, the determination of the status of the fuse must be accurate with the reduction in size of the semiconductor device structures.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device structure. The semiconductor device structure includes a first gate structure extending along a first direction and electrically connected to a first transistor, a second gate structure extending along the first direction and electrically connected to a second transistor, a first active region extending along a second direction different from the first direction and across the first gate structure and the second gate structure, and a first conductive element extending along the second direction and disposed on the first active region. The first conductive element is electrically connected to the first active region. The first conductive element is electrically connected to the first active region, such that a short circuit between the first active region and the third transistor is formed. The first gate structure and the first active region form a first fuse element, and the second gate structure and the first active region form a second fuse element.

Another aspect of the present disclosure provides a semiconductor device structure. The semiconductor device structure includes a plurality of gate structures extending along a first direction, a plurality of active regions extending along a second direction different from the first direction, a plurality of first transistors, and a plurality of second transistors. The plurality of gate structures and the plurality of active regions define a plurality of fuse elements. Each one of the plurality of first transistors is electrically connected to a corresponding one of the plurality of gate structures. Each one of the plurality of second transistors is electrically connected to a corresponding one of the plurality of active regions. The semiconductor device structure further includes a plurality of first conductive elements disposed on the active regions and extending along the second direction. Each of the plurality of first conductive elements electrically connects to a corresponding one of the active regions, respectively, such that a short circuit between the corresponding one of the plurality of active regions and a corresponding one of the plurality of second transistors is formed.

Another aspect of the present disclosure provides a semiconductor circuit. The semiconductor circuit includes a first fuse element, a second fuse element, a first conductive line, a reference resistor unit, a first switching circuit, and a latch circuit. The first fuse element includes a first terminal and a second terminal opposite to the first terminal. The second fuse element includes a first terminal and a second terminal opposite to the first terminal. The first conductive line is electrically connected to the second terminal of the first fuse element and the second terminal of the second fuse element. The reference resistor unit is configured to receive a first power signal and electrically connected with the first fuse element and the second fuse element. The first switching circuit is configured to electrically connect the reference resistor unit to the first fuse element and the second fuse element. The latch circuit is configured to read an evaluating signal of a first node between the reference resistor unit and one of the first fuse element and the second fuse element. The first conductive line is configured to form a short circuit between the first switching circuit and one of the first fuse element and the second fuse element.

The semiconductor device can provide reduced size with the shared active regions and gate structures, which form an array of fuse elements. The array of fuse elements shares the evaluating unit and status-blowing unit so that the size thereof can be reduced.

The shared active regions and gate structures may have parasitic resistance, which may affect the status-setting signal for blowing the fuse elements, and thus the blown resistance of the fuse element may be inaccurate. With conductive lines connected to the shared active regions and/or gate structures, the parasitic resistance of the shared active regions and gate structures can be avoided. Therefore, the fuse elements can be blown and tested accurately. Overall, the subject disclosure provides a semiconductor device with reduced size and accurate test results.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It can also be appreciated by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
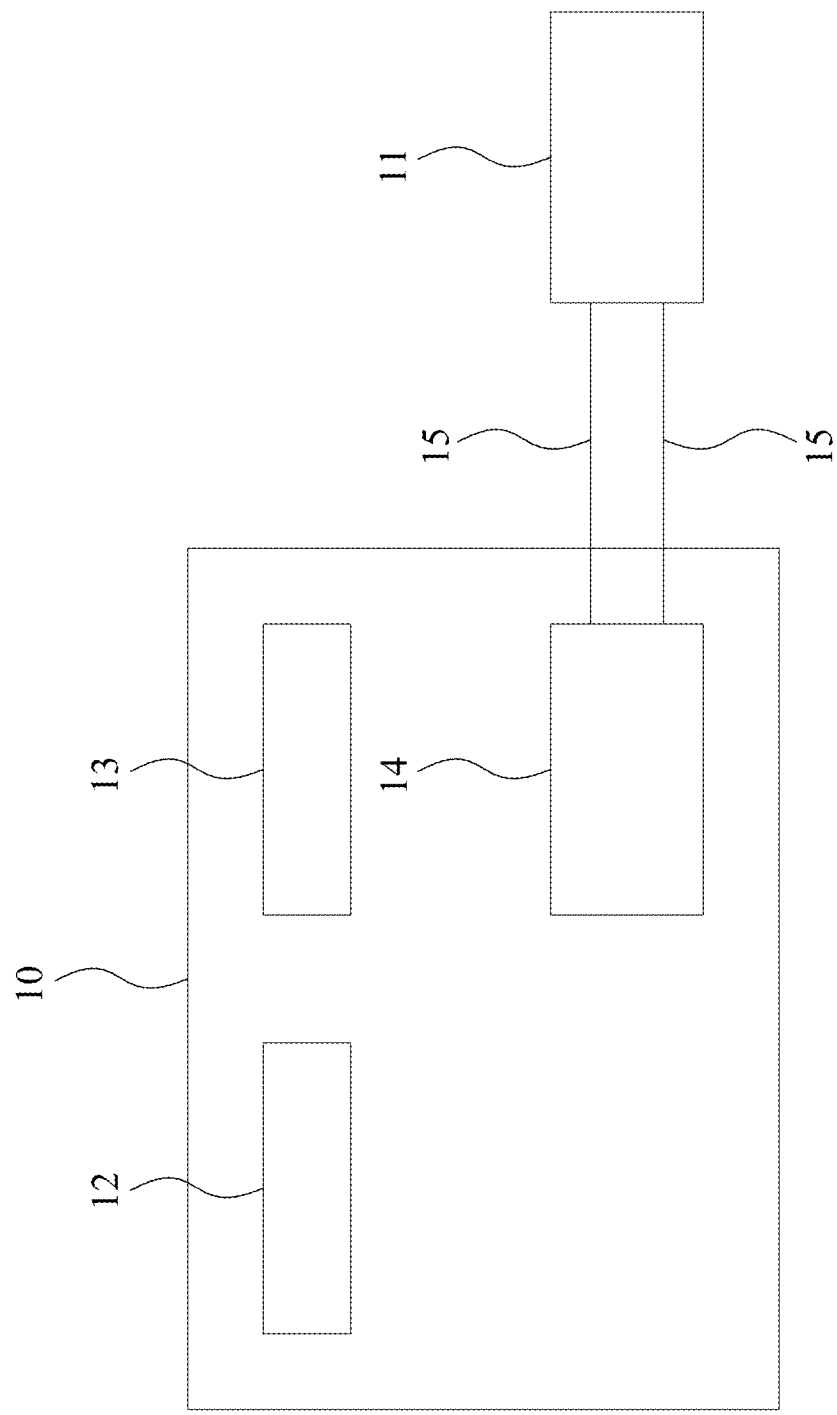
FIG. 1 is a schematic diagram of a system for testing a semiconductor device structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1 is a diagram of a system 10 for testing a semiconductor device, in accordance with some embodiments of the present disclosure.

According to FIG. 1, the system 10 is configured to monitor a semiconductor device structure 11. In some embodiments, the system 10 is configured to test the semiconductor device structure 11. The semiconductor device structure 11 may include a memory, memory device, memory die, or memory chip. In some embodiments, the semiconductor device structure 11 may include one or more memory cells. The semiconductor device structure 11 can be tested after fabrication, and shipped thereafter.

In some embodiments, the system 10 can constitute testing equipment. The system 10 may include hardware and software components that provide a suitable operational and functional environment for testing. In some embodiments, the system 10 may include a signal generator 12, a monitor 13, and a coupler 14.

The signal generator 12 is configured to generate a test signal. In some embodiments, the signal generator 12 can provide a power signal. It should be understood that other electrical signals such as data signals and power signals can further be provided to the semiconductor device structure 11.

The monitor 13 is configured to determine a status of the semiconductor device structure 11. The monitor 13 can be configured to determine a status of a component of the semiconductor device structure 11. The response signals can be identified by the monitor 13 to determine whether a component (e.g., a memory cell) of the semiconductor device structure 11 is a normal device or a redundant device.

The coupler 14 is configured to couple the signal generator 12 to the semiconductor device structure 11. In some embodiments, the coupler 14 can be coupled to the semiconductor device structure 11 by one or more probes 15. The probes 15 can be part of a probe head or probe package (not shown). The probes 15 can be electrically connected to test conductive terminals (pads) and/or bonding pads disposed on the semiconductor device structure 11. The test conductive pads and/or bonding pads provide electrical connections to an interconnect structure (e.g., wiring) of the semiconductor device structure 11. For example, some of the probes can be coupled to pads that are associated with a power supply terminal (e.g., VDD) and ground terminal (e.g., VSS) of the semiconductor device structure 11. Other probes can be coupled to pads associated with input/output (I/O) terminals (e.g., data signals) of the semiconductor device structure 11. As such, the system 10 is operable to apply electrical signals to the semiconductor device structure 11 and obtain response signals from the semiconductor device structure 11 during testing.

Figure 2:
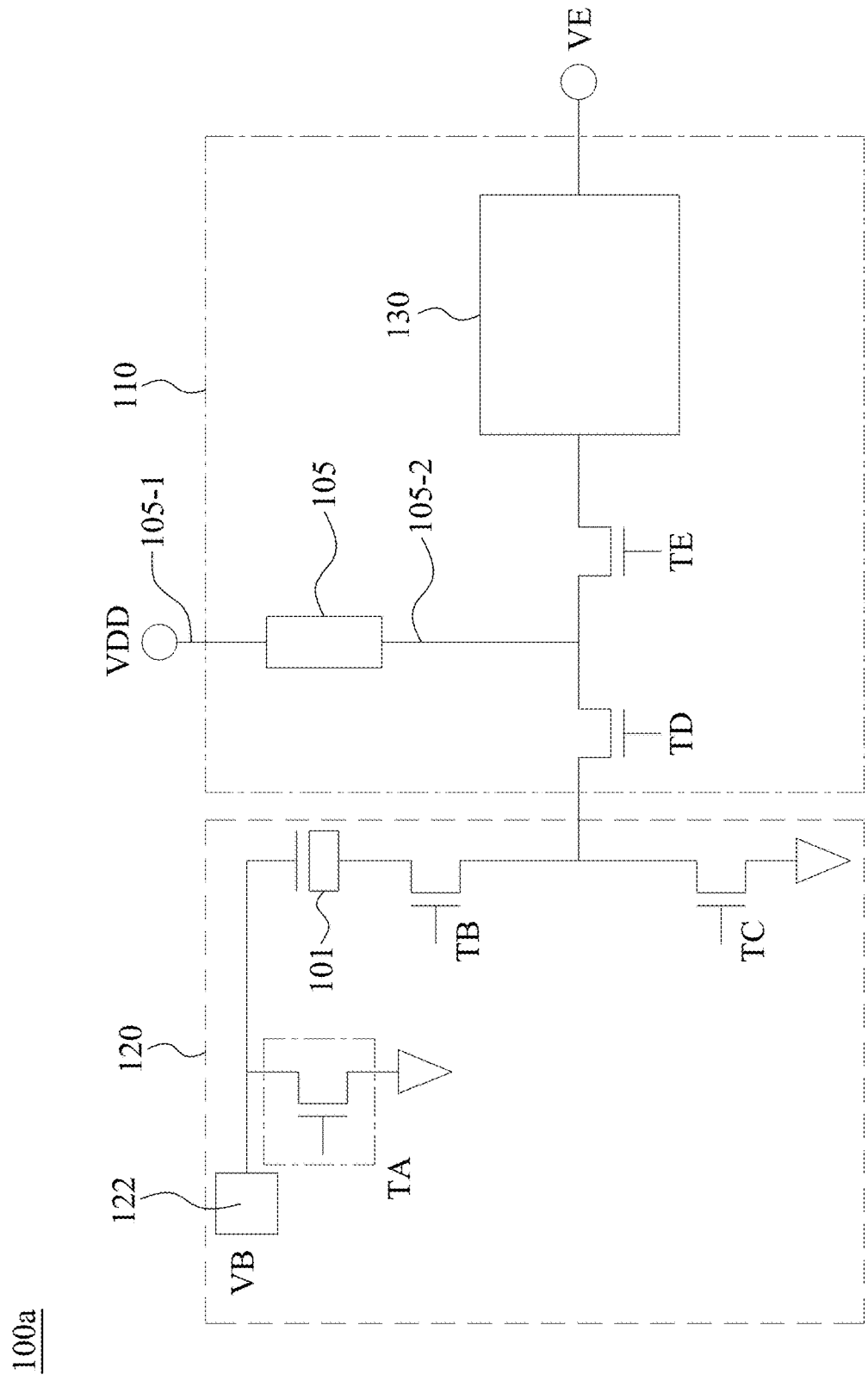
FIG. 2 is a schematic diagram of a semiconductor device structure, in accordance with some embodiments of the present disclosure.

FIG. 2 is a schematic diagram of a semiconductor device structure 100a, in accordance with some embodiments of the present disclosure. The semiconductor device structure 100a can include a memory, memory device, memory die, memory chip or other components. The semiconductor device structure 100a can be a portion of memory, memory device, memory die, or memory chip. For example, the memory can be a dynamic random access memory (DRAM). In some embodiments, the DRAM can be a double data rate four generation (DDR4) DRAM. In some embodiments, the memory includes one or more memory cells (or memory bits, memory blocks). In some embodiments, the memory cell includes a fuse element.

Referring to FIG. 2, the semiconductor device structure 100a can include a fuse element 101, an evaluating unit 110, and a status-setting unit 120. In some embodiments, the evaluating unit 110 can include a reference resistor unit 105, switching circuits TD and TE, and a latch circuit 130. In some embodiments, the fuse element 101 and the switching circuits TA and TB can act as a portion of the evaluating unit 110. In some embodiments, the status-setting unit 120 can include the fuse element 101, a conductive terminal 122, and two switching circuits TB and TC.

In some embodiments, the reference resistor unit 105 has a terminal 105-1 configured to receive a power signal VDD. The reference resistor unit 105 has a terminal 105-2 electrically connected to the fuse element 101. In some embodiments, the switching circuit TB can be electrically connected to the fuse element 101. The switching circuit TD can be electrically connected to the reference resistor unit 105. In some embodiments, the switching circuit TD can be electrically connected to the switching circuit TB. In some embodiments, the switching circuit TB can be electrically connected between the switching circuit TB and the reference resistor unit 105. In some embodiments, the fuse element 101 can be coupled to ground through the switching circuits TB and TC. The switching circuit TA can be electrically connected to the fuse element 101. The switching circuit TA can be electrically connected to ground.

In some embodiments, the latch circuit 130 is electrically connected to the reference resistor unit 105. The latch circuit 130 can be electrically connected to the fuse element 101 through the switching circuits TB, TD, and TE. In some embodiments, the switching circuit TE is electrically connected to the reference resistor unit 105. The switching circuit TE can be electrically connected to the latch circuit 130. In some embodiments, the switching circuit TE can be electrically connected to the switching circuit TD. An evaluation/output signal may be obtained at a conductive terminal VE of the latch circuit 130.

Referring to FIG. 2, the conductive terminal 122 can be electrically connected to the fuse element 101. The conductive terminal 122 may be a test pad, a probe pad, a conductive pad, a conductive terminal, or other suitable elements. In some embodiments, the conductive terminal 122 is configured to receive a status-setting signal VB. In some embodiments, the switching circuit TB can be electrically connected to the fuse element 101. The switching circuit TC can be electrically connected to the switching circuit TB. The switching circuit TB can be electrically connected between the switching circuit TC and the fuse element 101. The switching circuit TC can be electrically connected to ground.

In some embodiments, each of the switching circuits TA, TB, TC, TD, and TE can be a switch, transistor, or other switchable circuits.

Figure 2A:
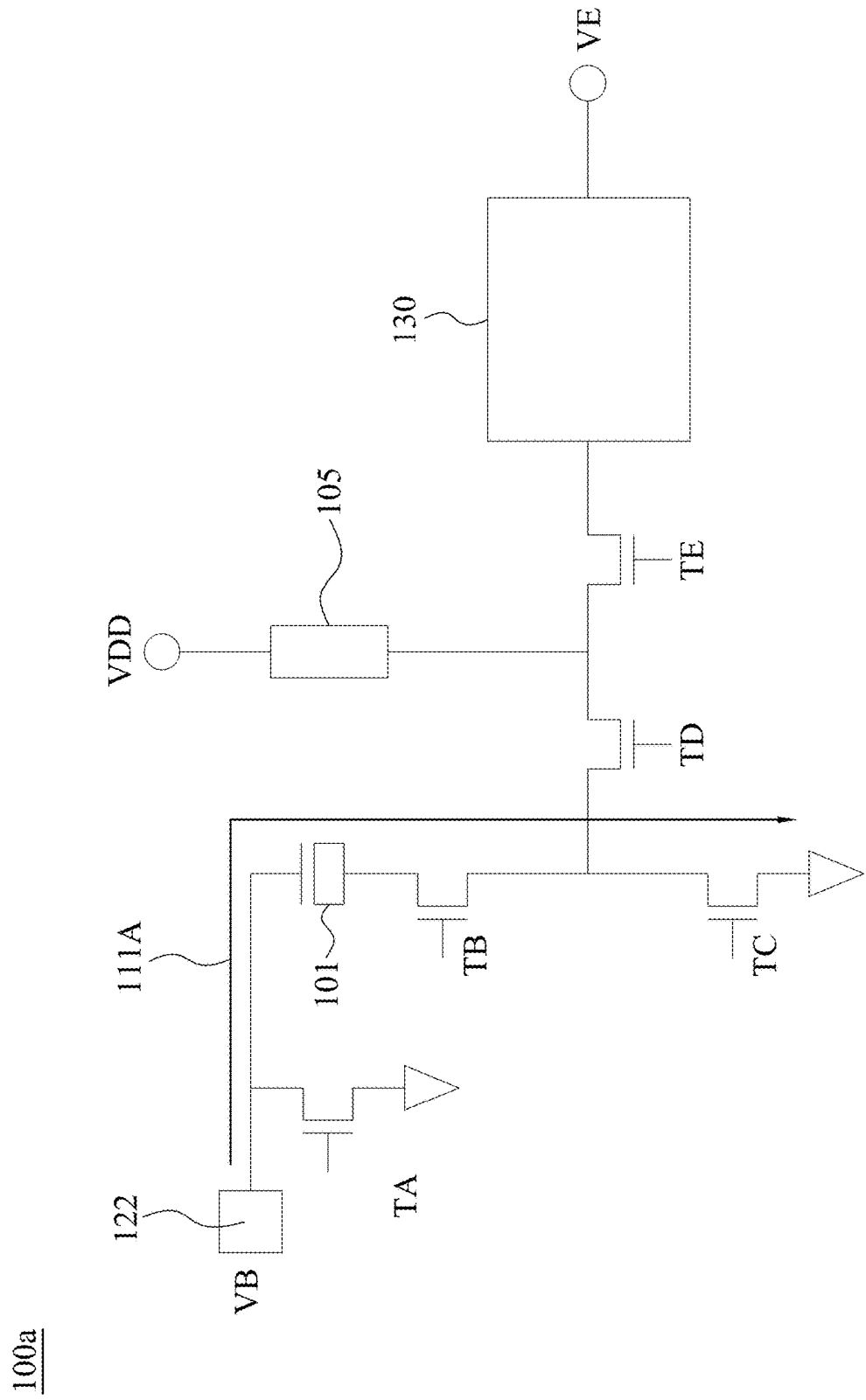
FIG. 2A is a schematic diagram of a semiconductor device structure, in accordance with some embodiments of the present disclosure.

FIG. 2A shows a semiconductor device structure 100a, in accordance with some embodiments of the present disclosure. In some embodiments, the switching circuits TB and TC are configured to be turned on to establish a conductive path 111A in response to the status-setting signal VB. In some embodiments, the conductive path 111A can pass through the fuse element 101 to ground in response to the status-setting signal VB. In some embodiments, when the status-setting signal VB is applied to the conductive terminal 122, the conductive path 111A passes through the fuse element 101, the switching circuits TB and TC, and to ground in order. In addition, the switching circuits TA, TD, and TE can be configured to be turned off, such that the conductive path 111A can pass through the fuse element 101.

In some embodiments, the status-setting signal VB may be a voltage signal or a current signal. In some embodiments, the status-setting signal VB may be a voltage signal having a voltage exceeding the normal operating voltage of the semiconductor device structure 100a. In some embodiments, the status-setting signal VB can have a voltage in a range of 4V-6V. In another embodiment, the status-setting signal VB can have a voltage in a range of 5V-6V. When the status-setting signal VB is applied, a status of the fuse element 101 may be changed. For example, the status-setting signal VB can be configured to burn down a gate dielectric layer of the fuse element 101 (not shown in FIG. 2A). In some embodiments, detailed description of the gate dielectric layer of the fuse element 101 can refer to the gate dielectric layer 606 in FIG. 6C. After the gate dielectric layer of the fuse element 101 is burned down, the physical property, such as resistance, density or other properties, of the 206 layer of the fuse element 101 is changed. Before the status-setting operation, the fuse element 101 may have a relatively high resistance. After the status-setting operation, the fuse element 101 may have a relatively low resistance. In the present disclosure, a fuse element before the status-setting operation can be referred to as an "unblown" fuse element, and a fuse element after the status-setting operation can be referred to as a "blown" fuse element.

The blown fuse element 101 has a resistance lower than the resistance of the unblown fuse element 101. In some embodiments, the fuse element 101 can be an anti-fuse. For example, the anti-fuse may be an e-fuse. In some embodiments, the anti-fuse includes a polysilicon e-fuse or other type of anti-fuse.

In one embodiment, the resistance of the unblown fuse element 101 can be in a range of 1.5M to 20MΩ. In another embodiment, the resistance of the unblown fuse element 101 may be in a range of 5M to 20MΩ. In some embodiments, the resistance of the unblown fuse element 101 may exceed 20MΩ. After the status-setting operation, the resistance of the blown fuse element 101 can be around 1 k to 800 kΩ. In one embodiment, the resistance of the blown fuse element 101 can be around 2 k to 20 kΩ. In another embodiment, the resistance of the blown fuse element 101 can be around 1 k to 400 kΩ. In some embodiments, the resistance of the blown fuse element 101 can be less than 1 kΩ.

Figure 2B:
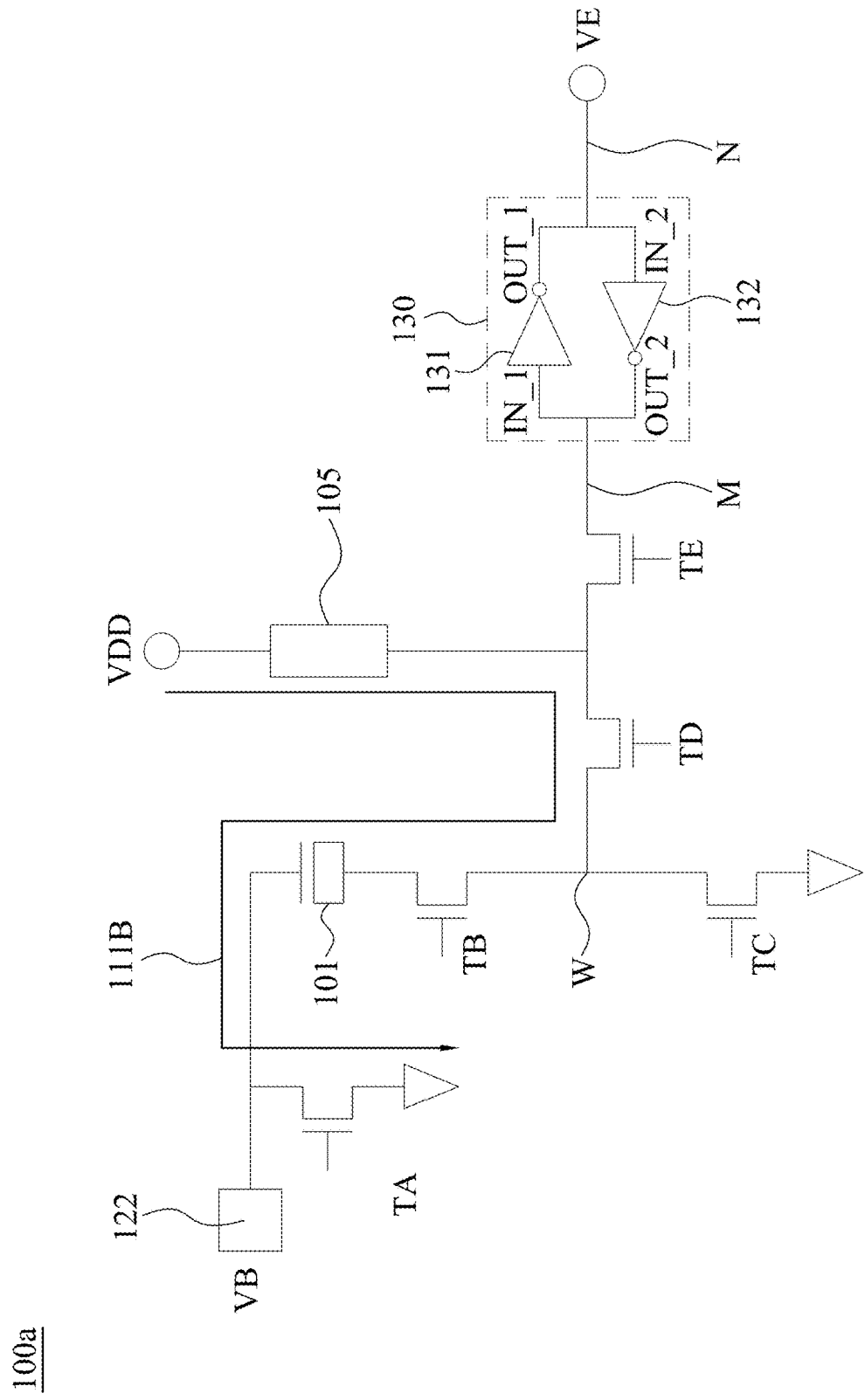
FIG. 2B is a schematic diagram of a semiconductor device structure, in accordance with some embodiments of the present disclosure.

FIG. 2B is a schematic diagram of a semiconductor device structure 100a, in accordance with some embodiments of the present disclosure. In some embodiments, the switching circuits TA, TB and TD are configured to be turned on to establish a conductive path 111B. In some embodiments, the conductive path 111B can pass through the reference resistor unit 105 and the fuse element 101 to ground in response to the power signal VDD. In some embodiments, the switching circuit TC is configured to be turned off so as to establish the conductive path 111B. In some embodiments, when the power signal VDD is applied to the terminal 105-1 of the reference resistor unit 105, the conductive path 111B passes through the reference resistor unit 105, the switching circuits TD and TB, the fuse element 101, and the switching circuit TA to ground, in that order. In some embodiments, the power signal VDD can be a normal operating voltage. In some embodiments, the power provided by the power signal VDD can be less than that of the status-setting signal VB. For example, the power signal VDD can have a voltage in a range of 1.0V to 1.5V. In one embodiment, the power signal VDD can have a voltage of around 1.2V.

In some embodiments, a signal M is generated at a node W between the reference resistor 105 and the fuse element 101, in response to the power signal VDD. Referring to FIG. 2B, the signal M generated at the node W can be transmitted to the latch circuit 130, through the switching circuits TD and TE.

In some embodiments, the latch circuit 130 is configured to read the signal M generated at the node W between the reference resistor 105 and the fuse element 101. The node W is between the reference resistor 105 and the fuse element 101 with or without other elements coupled therebetween. For example, the node W may be between the switching circuits TB and TD. In one embodiment, the node W may be between the switching circuit TD and the reference resistor unit 105. In another embodiment, the node W may be between the switching circuit TB and the fuse element 101. In some embodiments, the signal M may include a voltage signal or a current signal.

In some embodiments, the switching circuit TE is configured to be turned on to transmit the signal M to the latch circuit 130. During an evaluation period, when the switching circuits TA, TB, TD, and TE are configured to be turned on to establish the conductive path 111B, the signal M can be obtained at the node W and transmitted to the latch circuit 130. In some embodiments, the latch circuit 130 can read the signal M. In some embodiments, the latch circuit 130 can transform the signal M into a signal N. For example, the transformation of the signal M operated by the latch circuit 130 may include converting or inverting one signal into another. In one embodiment, the transformation of the signal M operated by the latch circuit 130 may include phase shifting. In another embodiment, the transformation of the signal M operated by the latch circuit 130 may include amplification.

In some embodiments, the latch circuit 130 can convert the analog signal M to a logic signal N. The latch circuit 130 can compare the signal M with a threshold, and, based on the result of the comparison between the signal M and the threshold, output the signal N. For example, when the signal M exceeds the threshold, the latch circuit 130 may output a logic low signal N. On the contrary, when the signal M is lower than the threshold, the latch circuit 130 may output a logic high signal N. In some embodiments, the signal N has a logic value opposite to that of the signal M. For example, when the signal M is logic "0," the signal N will be logic "1." On the contrary, when the signal M is logic "1," the signal N will be logic "0." In some embodiments, the latch circuit 130 can store the signal N.

Referring to FIG. 2B, the latch circuit 130 can include two inverters 131 and 132. In some embodiments, the latch circuit 130 can include more than two inverters. In some embodiments, the latch circuit 130 may be a latch circuit of another type. The inverter 131 has an input terminal IN_1 and an output terminal OUT_1. The inverter 132 has an input terminal IN_2 and an output terminal OUT_2. In some embodiments, the input terminal IN_1 of the inverter 131 can be connected to the reference resistor unit 105, through the switching circuit TE. The input terminal IN_1 of the inverter 131 can be connected to the fuse element 101, through the switching circuits TB, TD, and TE. The output terminal OUT_1 of the inverter 131 can be connected to the conductive terminal VE. In some embodiments, the input terminal IN_1 of the inverter 131 may be connected to the output terminal OUT_2 of the inverter 132. The output terminal OUT_1 of the inverter 131 may be connected to the input terminal IN_2 of the inverter 132. That is, the input terminal IN_2 of the inverter 132 can be connected to the conductive terminal VE. The output terminal OUT_2 of the inverter 132 can be connected to the reference resistor unit 105. The output terminal OUT_2 of the inverter 132 can be connected to the input terminal IN_1 of the inverter 131.

To evaluate the status of the fuse element 101 (i.e., whether the fuse element 101 is blown), the signal M (or signal N) is monitored. The signal M is dependent on the resistance of the fuse element 101. The signal M is compared with a predetermined signal or a threshold. Based on the comparison of the signal M and the predetermined signal, the logic signal N can be output at the conductive terminal VE. When the signal M exceeds the predetermined signal, it indicates that the fuse element 101 is not blown. When the signal M fails to exceed the predetermined signal, it indicates that the fuse element 101 is blown.

In some embodiments, if the signal M exceeds the predetermined signal, the latch circuit 130 can output a logic low signal N. That is, the logic low signal N indicates that the fuse element 101 is not blown. When the signal M is lower than the predetermined signal, the latch circuit 130 may output a logic high signal N. In other words, logic high signal N indicates that the fuse element 101 is blown.

The signal N may be obtained at the conductive terminal VE, such that the status of the fuse element 101 can be determined. The status of the fuse element 101 can be utilized to determine whether the semiconductor device structure is a redundant device or a normal device.

Figure 2C:
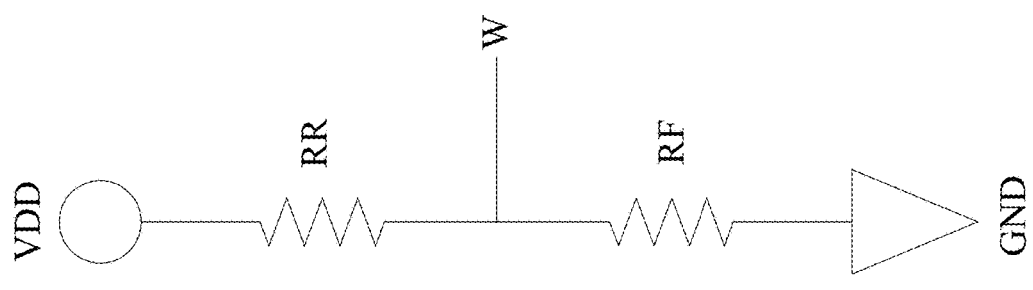
FIG. 2C illustrates an equivalent circuit of a portion of the semiconductor device shown in FIG. 2B, in accordance with some embodiments of the present disclosure.

FIG. 2C illustrates an equivalent circuit 20 of a portion of the semiconductor device structure 100a when the conductive path 111B is established, in accordance with the embodiments of the subject disclosure. The equivalent circuit 20 is in configuration with switching circuits TA, TB and TD when they are on and in configuration with the switching circuit TC when it is off In other words, the equivalent circuit 20 presents a simplified circuit through which the conductive path 111B passes.

The equivalent circuit 20 includes two resistors RR and RF. In some embodiments, the resistor RR can be the resistance of the reference resistor unit 105. The resistor RF can be the resistance of the fuse element 101. In some embodiments, the resistor RR can be connected to the resistor RF in series. A node W is between the resistor RR and the resistor RF. That is, the node W in FIG. 2C corresponds to the node in FIG. 2B. In some embodiments, the resistor RR is configured to receive a power signal VDD. For example, the power signal VDD may be a voltage of 1.2V. In some embodiments, the resistor RF is connected to the resistor RR and the ground.

Referring to FIG. 2C, the signal M may be a voltage signal obtained at the node W. Therefore, the signal M can be calculated according to equation 1.

$$X = \frac{RF}{RR+RF} VDD, \qquad \text{[Equation 1]}$$

In equation 1, M represents the voltage of the signal M; RR represents the resistance of the reference resistor unit 105; RF represents the resistance of the fuse element 101; and VDD represents the power signal.

To evaluate the status of the fuse element 101 accurately, the resistance RR can fall below the resistance RF of the unblown fuse element. In addition, the resistance RR can exceed the resistance RF of the blown fuse element. In some embodiments, the resistance RR may be between the resistance of the unblown fuse element and the resistance of the blown fuse element.

In one embodiment, the resistance of the unblown fuse element 101 can be in a range of 1.5M to 20MΩ. In another embodiment, the resistance of the unblown fuse element 101 may be in a range of 5M to 20MΩ. In some embodiments, the resistance of the unblown fuse element 101 may exceed 20MΩ. After the status-setting operation, the resistance of the blown fuse element 101 can be 1 k to 800 kΩ. In one embodiment, the resistance of the blown fuse element 101 can be 2 k to 20 kΩ. In another embodiment, the resistance of the blown fuse element 101 may exceed 100 kΩ. In some embodiments, the resistance of the blown fuse element 101 can be 100 k to 400 kΩ.

In some embodiments, the predetermined signal has a voltage less than that of the power signal VDD. In some embodiments, the predetermined signal has a voltage, which fractionally multiplies the power signal VDD. For example, if the predetermined signal has a voltage half of the power signal VDD, for example of 1.2V, the predetermined signal can have a voltage of 0.6V. That is, when the result of the equation 1 exceeds 0.6V, the signal M at the node W would be determined as logic high, indicating that the fuse element 101 is not blown, and when less than 0.6V, the signal M at the node W would be determined as logic low, indicating that the fuse element 101 is blown.

Figure 3:
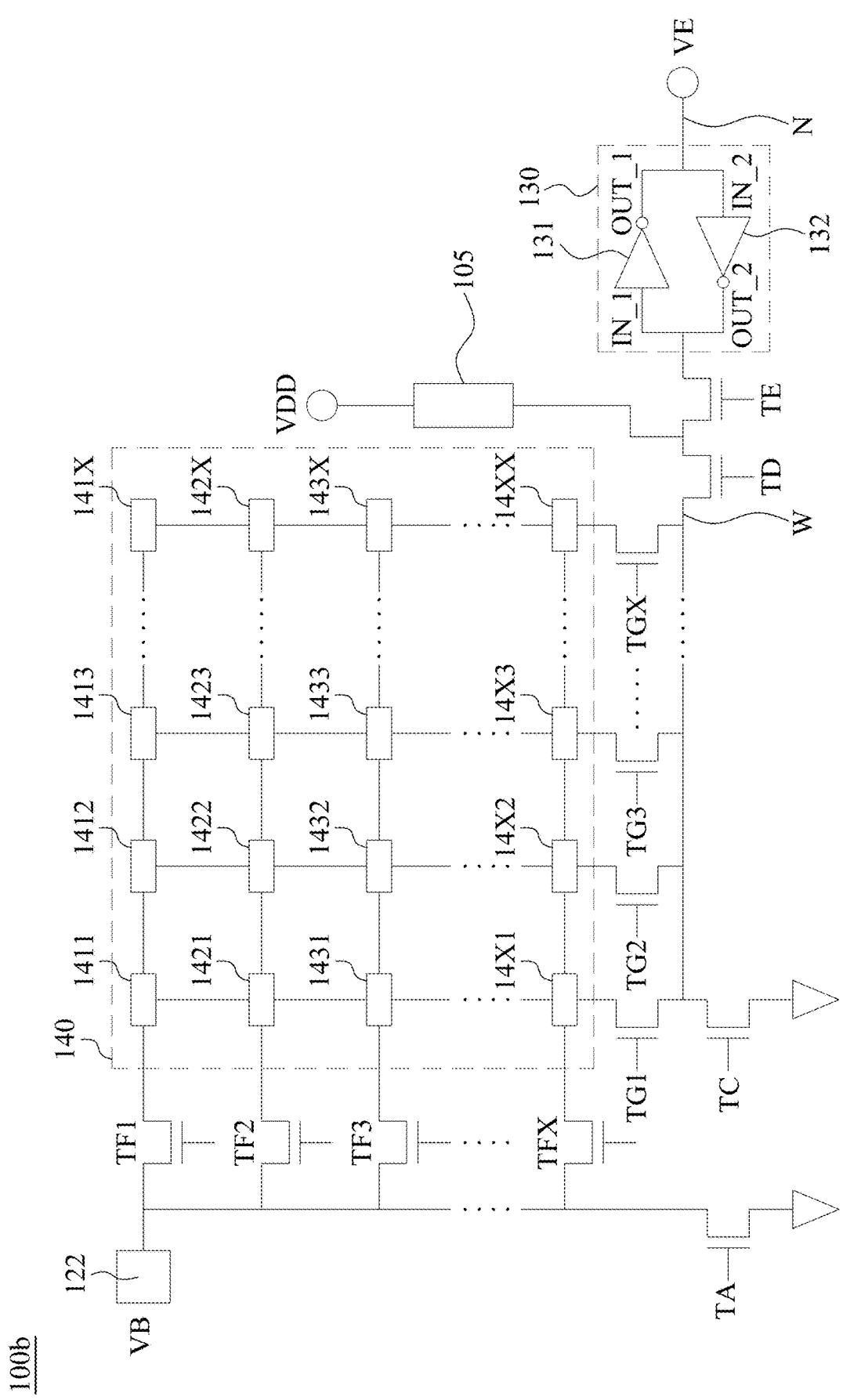
FIG. 3 is a schematic diagram of a semiconductor device structure, in accordance with some embodiments of the present disclosure.

FIG. 3 is a schematic diagram of a semiconductor device structure 100b, in accordance with some embodiments of the present disclosure. The semiconductor device structure 100b is similar to the semiconductor device structure 100a as shown in FIG. 1, differing in that the semiconductor device structure 100b can include a fuse structure 140.

In some embodiments, the fuse structure 140 can include a plurality of fuse elements. In some embodiments, the fuse elements of the fuse structure 140 can form an n×n array. For example, the fuse structure 140 can include fuse elements 1411, 1412, 1413, . . . , and 141X forming the first row. M can be a positive integer ranging from 1 to n. The fuse structure 140 can include fuse elements 1421, 1422, 1423, . . . , and 142X forming the second row. The fuse structure 140 can include fuse elements 1431, 1432, 1433, . . . , and 143X forming the third row. The fuse structure 140 can include fuse elements 14X1, 14X2, 14X3, . . . , and 14XX form the Xth row. Further, the fuse elements 1411, 1421, 1431, . . . , and 14X1 form the first column. The fuse elements 1412, 1422, 1432, . . . , and 14X2 form the second column. The fuse elements 1413, 1423, 1433, . . . , and 14X3 form the third column. The fuse elements 141X, 142X, 143X, . . . , and 14XX form the Xth column.

In some embodiments, the semiconductor device structure 100b can include a plurality of transistors, such as transistors TF1, TF2, TF3, and TFX. The transistors TF1-TFX can be configured to turn on or turn off the row of the fuse structure 140. For example, the transistors TF1-TFX can be electrically connected to the fuse elements 1411-141X, 1421-142X, 1431-143X, and 14X1-14XX, respectively. The transistors, such as TF1-TFX, can be electrically connected between the conductive terminal 122 and the fuse structure 140.

In some embodiments, the semiconductor device structure 100b can include a plurality of transistors, such as transistors TG1, TG2, TG3, and TGX. The transistors TG1-TGX can be configured to turn on or turn off the column of the fuse structure 140. For example, the transistors TG1-TGX can be electrically connected to the fuse elements 1411-14X1, 1412-14X2, 1413-14X3, and 141X-14XX, respectively. The transistors TG1-TGX can be electrically connected between the switching circuit TD and the fuse structure 140.

In some embodiments, the fuse structure 140 shares one switching circuit TA. In some embodiments, the fuse structure 140 shares one switching circuit TC. In some embodiments, the fuse structure 140 shares one switching circuit TD. In some embodiments, the fuse structure 140 shares one reference resistor unit 105. In some embodiments, the fuse structure 140 shares one latch circuit 130. In comparison with the semiconductor device structure 100a shown in FIG. 2, of which one switching circuit TA, TC or TD is electrically connected to merely one fuse element 101, the semiconductor device structure 100b can have a relatively small size.

Figure 3A:
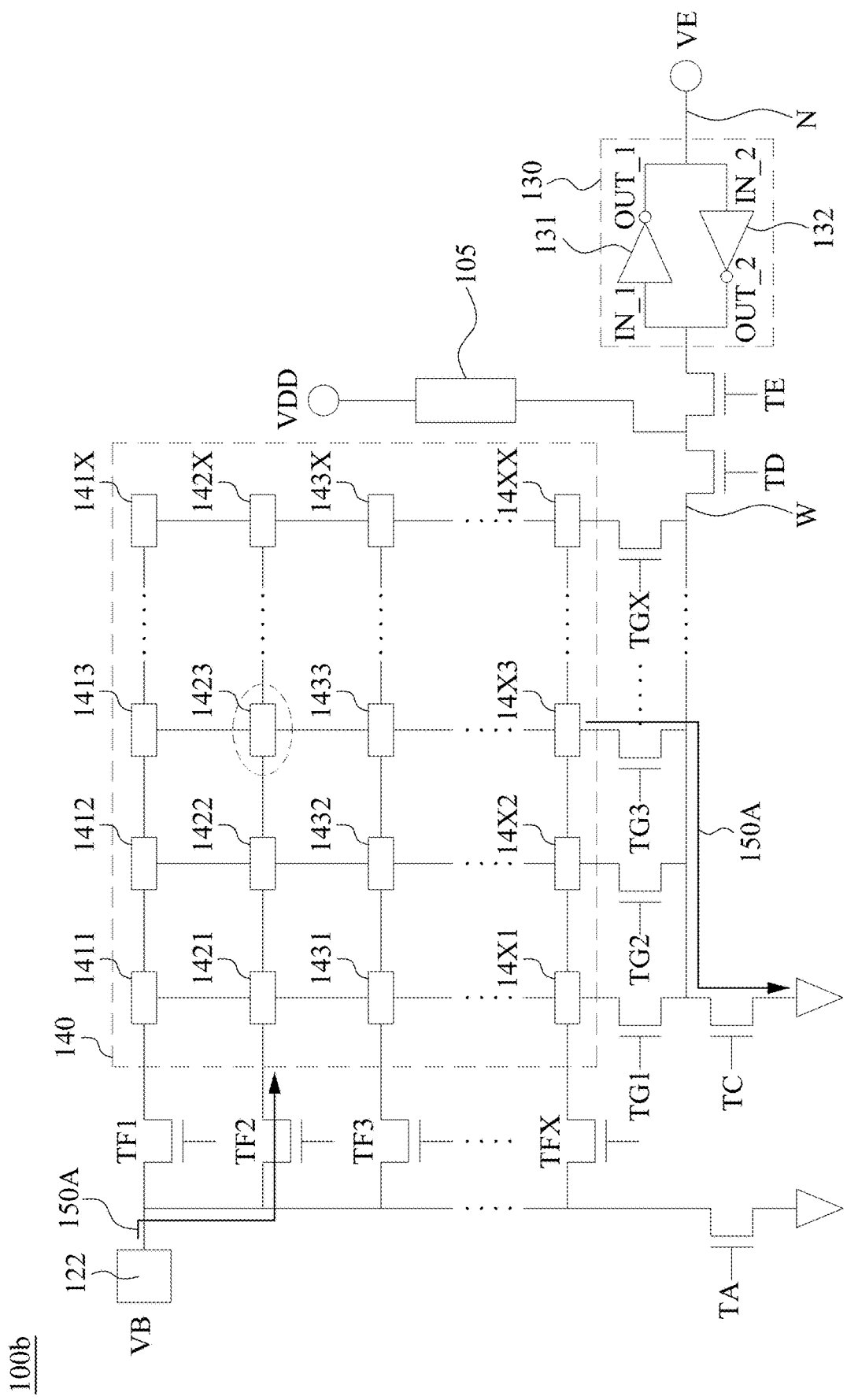
FIG. 3A is a schematic diagram of a semiconductor device structure, in accordance with some embodiments of the present disclosure.

FIG. 3A is a schematic diagram of a semiconductor device structure 100b, in accordance with some embodiments of the present disclosure.

In some embodiments, one of the transistors (e.g., transistor TF1, TF2, TF3 or TFX), one of the transistors (e.g., transistor TG1, TG2, TG3 or TGX), and the switching circuit TC are configured to be turned on to establish a conductive path 150A passing through one of the fuse elements 1411-14XX, in response to the status-setting signal VB. In some embodiments, the conductive path 150A to the ground can pass through one of the fuse elements 1411-14XX in response to the status-setting signal VB. For example, when the transistors TF2 and TG3 are turned on, the conductive path 150A will pass through the transistor TF2, fuse element 1423, the transistor TG3 and the switching circuit TC to ground, in that order. In addition, the switching circuits TA, TD, and TE can be configured to be turned off, such that the conductive path 150A can pass through one of the fuse elements 1411-14XX.

In some embodiments, the status-setting signal VB may be a voltage signal or a current signal. In some embodiments, the status-setting signal VB may be a voltage signal having a voltage exceeding the normal operating voltage of the semiconductor device structure 100b. In some embodiments, the status-setting signal VB can have a voltage in a range of 4V-7V, such as 4V, 4.5V, 5V, 5.5V, 6V, 6.5V or 7V. When the status-setting signal VB is applied, a status of one of the fuse elements 1411-14XX may be changed. For example, the status-setting signal VB can be configured to burn down a gate dielectric layer (not shown) of the one of the fuse elements 1411-14XX. Before the status-setting operation, the fuse elements 1411-14XX may have a relatively high resistance. After the status-setting operation, the fuse element (such as the fuse element 1423) through which the conductive path 150A passes may have a relatively low resistance in comparison with other fuse elements (such as the fuse element 1411).

Figure 3B:
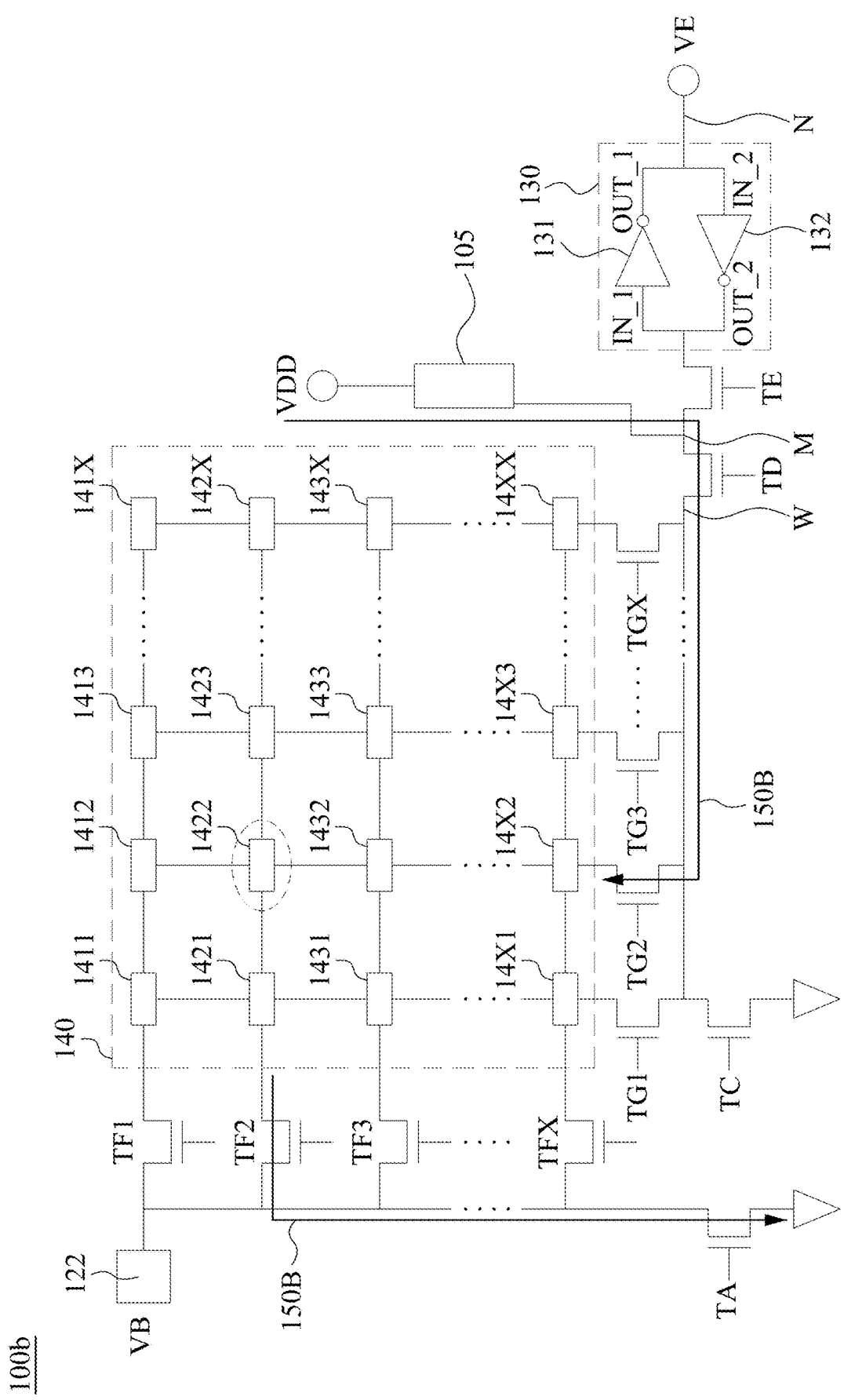
FIG. 3B is a schematic diagram of a semiconductor device structure, in accordance with some embodiments of the present disclosure.

FIG. 3B is a schematic diagram of a semiconductor device structure 100b, in accordance with some embodiments of the present disclosure.

In some embodiments, one of the transistors (e.g., transistor TF1, TF2, TF3 or TFX), one of the transistors (e.g., transistor TG1, TG2, TG3 or TGX), and the switching circuits TA and TD are configured to be turned on to establish a conductive path 150B through one of the fuse elements 1411-141X. In some embodiments, the conductive path 150B can pass through the reference resistor unit 105 and one of the fuse elements 1411-141X to ground in response to the power signal VDD. In some embodiments, the conductive path 150B passes through the reference resistor unit 105, the switching circuit TD, one of the transistors (e.g., the transistor TG1, TG2, TG3 or TGX), one of the fuse elements 1411-141X, one of the transistors (e.g., the transistor TF1, TF2, TF3 or TFX) and the switching circuit TA to ground, in that order. For example, when the transistors TF2 and TG2 are turned on, the conductive path 150B will pass through the switching circuit TD, transistor TG2, fuse element 1422, transistor TF2 and switching circuit TA to ground, in that order. In some embodiments, the switching circuit TC is configured to be turned off so as to establish the conductive path 150B.

In some embodiments, the power signal VDD can be a normal operating voltage. In some embodiments, the power provided by the power signal VDD can be less than that of the status-setting signal VB. For example, the power signal VDD can have a voltage ranging from 1V-1.5V, such as 1V, 1.1V, 1.2V, 1.3V, 1.4V or 1.5V.

In some embodiments, a signal M is generated at a node W between the reference resistor unit 105 and one of the fuse elements 1411-14XX, in response to the power signal VDD. Referring to FIG. 3B, the signal M generated at the node W can be transmitted to the latch circuit 130, through the switching circuits TD and TE.

In some embodiments, the latch circuit 130 is configured to read the signal M generated at the node W between the reference resistor unit 105 and one of the fuse elements 1411-14XX. The node W is between the reference resistor unit 105 and one of the fuse elements 1411-14XX with or without other elements coupled therebetween. For example, the node W may be between one of the transistors (e.g., the transistor TG1, TG2, TG3 or TGX) and the switching circuit TD. In one embodiment, the node W may be between the switching circuit TD and the reference resistor unit 105. In some embodiments, the signal M may include a voltage signal or a current signal.

In some embodiments, the switching circuit TE is configured to be turned on to transmit the signal M to the latch circuit 130. During an evaluation period, when the switching circuits TA, TD, and TE as well as one of the transistors TG1-TGX and one of the transistors TF1-TFX are configured to be turned on to establish the conductive path 150B, the signal M can be obtained at the node W and transmitted to the latch circuit 130.

To evaluate the status of one of the fuse elements 1411-14XX (i.e., whether one of the fuse elements 1411-14XX is blown), the signal M (or signal N) is monitored. The signal M is dependent on the resistance of one of the fuse elements 1411-14XX. The signal M is compared with a predetermined signal or a threshold. Based on the comparison of the signal M and the predetermined signal, the logic signal N can be output at the conductive terminal VE. When the signal M exceeds the predetermined signal, it indicates that the one of the fuse elements 1411-14XX is not blown. When the signal M fails to exceed the predetermined signal, it indicates that the one of the fuse elements 1411-14XX is blown.

In some embodiments, if the signal M exceeds the predetermined signal, the latch circuit 130 can output a logic low signal N. That is, the logic low signal N indicates that the one of the fuse elements 1411-14XX is not blown. When the signal M is lower than the predetermined signal, the latch circuit 130 may output a logic high signal N. In other words, logic high signal N indicates that the one of the fuse elements 1411-14XX is blown.

The signal N may be obtained at the conductive terminal VE, such that the status of the one of the fuse elements 1411-14XX can be determined. The status of the one of the fuse elements 1411-14XX can be utilized to determine whether the semiconductor device structure is a redundant device or a normal device.

For example, the fuse element 1423 is blown when the conductive path 150A is established as shown in FIG. 3A. In this case, the signal M, which is generated at the node W between the reference resistor unit 105 and the fuse element 1423, will fail to exceed the predetermined signal. As a result, the latch circuit 130 will output a logic high signal N.

Figure 4:
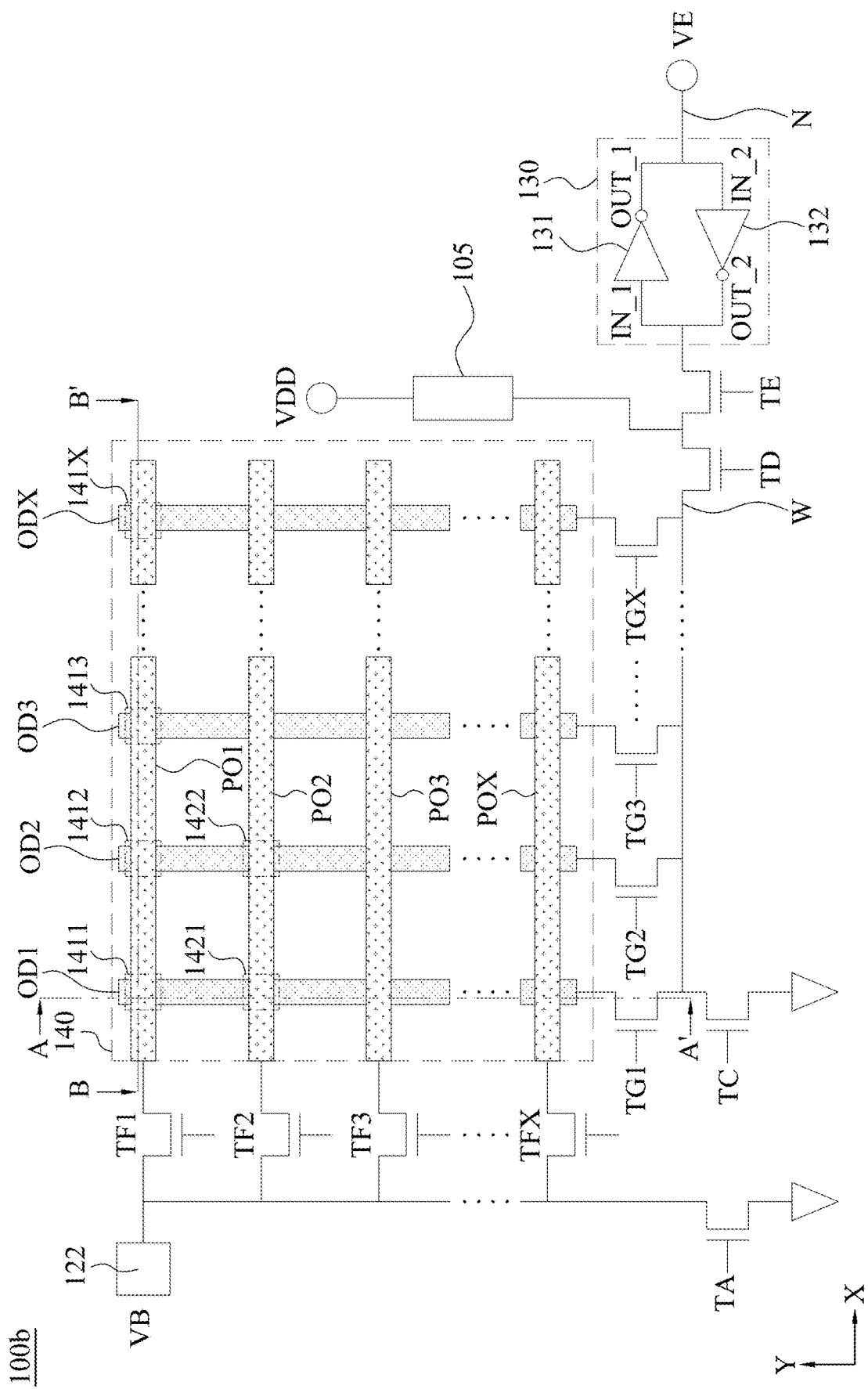
FIG. 4 is a schematic diagram of a layout of fuse elements of the semiconductor device structure shown in FIG. 3, in accordance with some embodiments of the present disclosure.

FIG. 4 is a schematic diagram of a layout of the fuse structure 140 of the semiconductor device structure 100b shown in FIG. 3, in accordance with some embodiments of the present disclosure.

In some embodiments, the semiconductor device structure 100b can include a plurality of gate structures (e.g., the gate structures PO1, PO2, PO3, . . . , and POX) extending along the X-axis. In some embodiments, the semiconductor device structure 100b can include a plurality of active regions (e.g., the active regions OD1, OD2, OD3, . . . , and ODX) extending along the Y-axis. Each of the active regions OD1, OD2, OD3 and ODX can cross the gate structures PO1-POX. Likewise, each of the gate structures PO1-POX can cross the active regions OD1-ODX. One of the gate structures PO1-POX and one of the active regions OD1-ODX can collaboratively form or define a fuse element. For example, the gate structure PO1 can overlap the active region OD1, and thus the overlapping area of the gate structure PO1 and the active region OD1 can define the fuse element 1411.

In some embodiments, each of the gate structures PO1-POX can serve as the first terminal of one of the fuse elements 1411-14XX. In some embodiments, each of the gate structures PO1-POX can be electrically connected to one of the corresponding transistors TF1-TFX, respectively. In some embodiments, each of the active regions OD1-ODX can serve as the second terminal of the one of the fuse elements 1411-14XX. In some embodiments, each of the active regions OD1-ODX can be electrically connected to one of the corresponding transistors TG1-TGX, respectively. For example, the gate structure PO1 can serve as the first terminal of the fuse element 1412 and is electrically connected to the transistor TF1. The active region OD2 can serve as the second terminal of the fuse element 1412 and is electrically connected to the transistor TG2.

Figure 5:
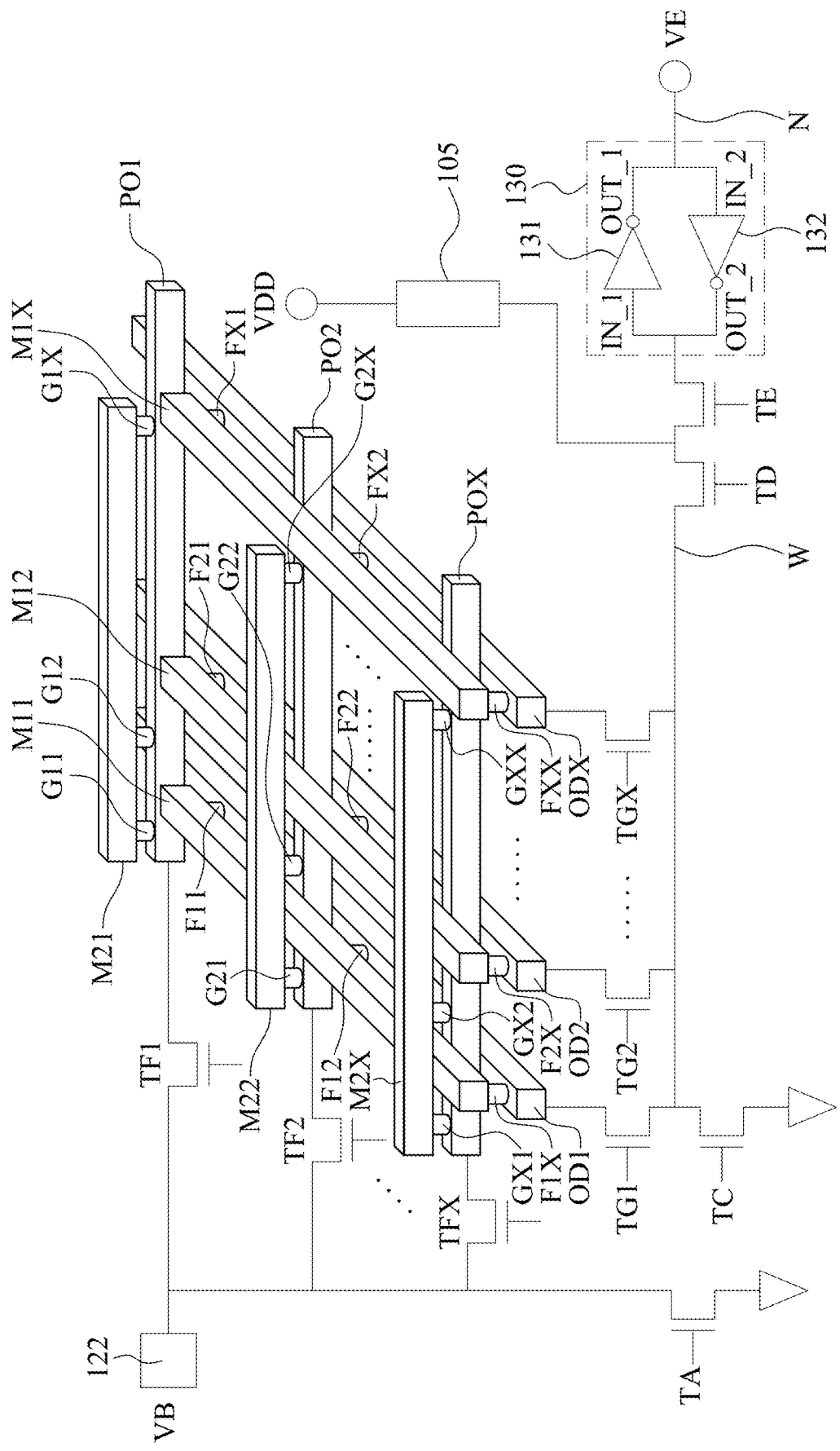
FIG. 5 is a perspective view of a semiconductor device, in accordance with some embodiments of the present disclosure.

FIG. 5 is a perspective view of a semiconductor device structure 500, in accordance with some embodiments of the present disclosure. In some embodiments, the view of semiconductor device structure 500 shows a three-dimensional perspective of the semiconductor device structure 100b shown in FIG. 4, differing therefrom in that FIG. 5 further includes conductive elements M11-M1X and M21-M2X, and contacts F11-FX1, F21-F2X, . . . , F1X-FXX, and G11-G1X, G21-G2X, . . . , GX1-GXX.

In some embodiments, the conductive elements M11, M12, . . . , and M1X can be disposed on the active regions OD1, OD2, . . . , and ODX. The conductive elements M11-M1X can be disposed on and across the gate structures PO1-POX. The conductive elements M11-M1X can extend parallel to the active regions OD1-ODX. That is, the conductive elements M11-M1X can extend perpendicular to the gate structures PO1-POX.

In some embodiments, each of the conductive elements M11-M1X can be aligned with a corresponding one of the active regions OD1-ODX from a top view. In another embodiment, each of the conductive elements M11-M1X can overlap with a corresponding one of the active regions OD1-ODX from a top view. For example, the conductive element M11 can overlap with the active region OD1. The conductive element M11 can be disposed directly above the active region OD1. Similarly, the conductive element M12 can be disposed directly on the active region OD2. The conductive element M1X can be disposed directly on the active region ODX.

The conductive elements M11-M1X can be disposed within a dielectric layer (not shown). In some embodiments, each of the conductive elements M11-M1X can be separated by the dielectric layer. The conductive elements M11-M1X can be metal lines. The conductive elements M11-M1X can include metal material.

The conductive elements M11-M1X can be electrically connected to the active regions OD1-ODX. In some embodiments, the conductive element M11 can be electrically connected to the active region OD1 through one or more of the contacts F11, F12, . . . , and F1X. The conductive element M12 can be electrically connected to the active region OD2 through one or more of the contacts F21, F22, . . . , F2X. The conductive element M1X can be electrically connected to the active region ODX through one or more of the contacts FX1, FX2, . . . , FXX.

Each of the contacts F11-F1X can be disposed adjacent to one of the gate structures PO1-POX. For example, the contact F11 can be disposed adjacent to the gate structure PO1. In some embodiments, the contact F11 can be disposed between the gate structures PO1 and PO2. The contact F12 can be disposed adjacent to the gate structure PO2. In some embodiments, the contact F12 can be disposed between the gate structures PO2 and PO3 (not shown). The contact F1X can be disposed adjacent to the gate structure POX. In some embodiments, the contact F1X can be disposed adjacent to an edge of the active region OD1.

In some embodiments, the contact F11 can have a projection on the active region OD1 adjacent to a projection of the gate structure PO1 on the active region OD1. The contact F12 can have a projection on the active region OD1 adjacent to a projection of the gate structure PO2 on the active region OD1. The contact F1X can have a projection on the active region OD1 adjacent to a projection of the gate structure POX on the active region OD1. The contacts F21-F2X, . . . , FX1-FXX can be disposed on the active regions OD1-ODX, respectively, in a similar manner.

The contacts F11-FXX can be conductive vias, or other suitable connecting elements. The contacts F11-FXX can include metal material. The shape of the contacts F11-FXX is not limited.

In some embodiments, the conductive elements M21, M22, . . . , and M2X can be disposed on the gate structures PO1, PO2, . . . , and POX. The conductive elements M21-M2X can be disposed on and across the active regions OD1, OD2, . . . , and ODX. The conductive elements M21-M2X can extend parallel to the gate structures PO1-POX. That is, the conductive elements M21-M2X can extend perpendicular to the active regions OD1-ODX.

In one embodiment, the conductive elements M21-M2X can be disposed on the conductive elements M11-M1X as shown in FIG. 5. That is, the conductive elements M11-M1X can be disposed between the conductive elements M21-M2X and the active regions OD1-ODX. In another embodiment, the conductive elements M21-M2X may be disposed under the conductive elements M11-M1X (not shown). A level of the conductive elements M21-M2X and that of the conductive elements M11-M1X can be exchanged.

In some embodiments, each of the conductive elements M21-M2X can be aligned with a corresponding one of the gate structures PO1-POX from a top view. In another embodiment, each of the conductive elements M21-M2X can overlap with a corresponding one of the gate structures PO1-POX from a top view. For example, the conductive element M21 can overlap with the gate structure PO1. The conductive element M21 can be disposed directly above the gate structure PO1. Similarly, the conductive element M22 can be disposed directly on the gate structure PO2. The conductive element M2X can be disposed directly on the gate structure POX.

The conductive elements M21-M2X can be disposed within a dielectric layer (not shown). In some embodiments, each of the conductive elements M21-M2X can be separated by the dielectric layer. The conductive elements M21-M2X can be metal lines or metal tracks.

The conductive elements M21-M2X can be electrically connected to the gate structures PO1-POX. In some embodiments, the conductive element M21 can be electrically connected to the gate structure PO1 through one or more of the contacts G11, G12, . . . , and G1X. The conductive element M22 can be electrically connected to the gate structure PO2 through one or more of the contacts G21, G22, . . . , and G2X. The conductive element M2X can be electrically connected to the gate structure POX through one or more of the contacts GX1, GX2, . . . , and GXX.

Each of contacts G11-G1X can be disposed adjacent to one of the active regions OD1-ODX from atop view. For example, the contact G11 can have a projection on the gate structure PO1 adjacent to a projection of the active region OD1 of the gate structure PO1. In some embodiments, the contact G11 can be disposed adjacent to an edge of the gate structure PO1. The projection of contact G11 on the gate structure PO1 is between to the projection of the active region OD1 on the gate structure PO1 and the edge of the gate structure PO1. The contact G12 can have a projection on the gate structure PO1 adjacent to a projection of the active region OD2 on the gate structure PO1. In some embodiments, the projection of the contact G12 on the gate structure PO1 can be disposed between the projection of the active region OD1 on the gate structure PO1 and the projection of the active region OD2 on the gate structure PO1. The contact G1X can have a projection on the gate structure PO1 adjacent to a projection of the active region ODX on the gate structure PO1. In some embodiments, the projection of the contact G1X can be disposed between a projection of the active region ODX-1 (not shown) on the gate structure PO1 and the projection of the active region ODX on the gate structure PO1.

The contacts G21-G2X, ..., and GX1-GXX can be disposed on the gate structures PO2-POX, respectively, in a similar manner. The contacts G11-GXX can be conductive vias, or other suitable connecting elements. The contacts G11-GXX can include metal material.

Figure 6A:
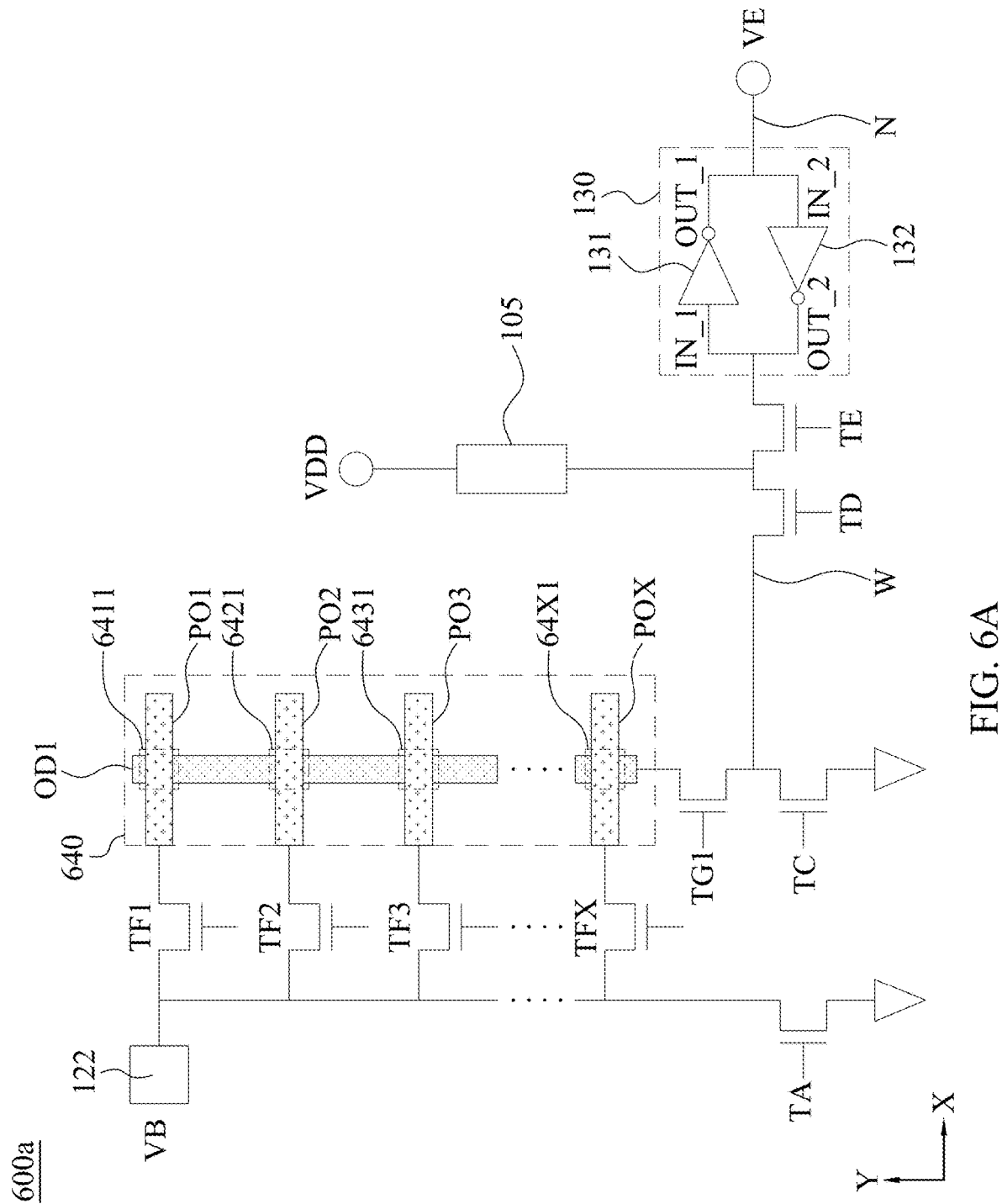
FIG. 6A is a schematic diagram of a layout of fuse elements of a semiconductor device structure, in accordance with some embodiments of the present disclosure.

FIG. 6A is a schematic diagram of a layout of fuse elements of a semiconductor device structure 600a, in accordance with some embodiments of the present disclosure. The semiconductor device structure 600a is similar to the semiconductor device 100b in FIG. 4, differing therefrom in that the fuse structure 640 includes one column of fuse elements.

The fuse structure 640 includes an active region OD1 extending along the Y-axis. The fuse structure 640 includes a plurality of gate structures PO1, PO2, PO3, ..., and POX extending along the X-axis. The active region OD1 can cross the gate structures PO1-POX. One of the gate structures PO1-POX and the active region OD1 can collaboratively form or define a fuse element. For example, the gate structure PO1 can overlap the active region OD1, and thus the overlapping area of the gate structure PO1 and the active region OD1 can define the fuse element 6411. Similarly, the active region OD1 and the gate structure PG2 can define a fuse element 6421. The active region OD1 and the gate structure PO3 can define a fuse element 6431. The active region OD1 and the gate structure POX can define a fuse element 64X1.

In some embodiments, each of the gate structures PO1-POX can serve as the first terminal of one of the fuse elements 6411-64X1. In some embodiments, each of the gate structures PO1-POX can be electrically connected to one of the corresponding transistors TF1-TFX, respectively. In some embodiments, the active region OD1 can serve as the second terminal of the one of the fuse elements 6411-64X1. In some embodiments, the active region OD1 can be electrically connected to the transistor TG1. For example, the gate structure PO2 can serve as the first terminal of the fuse element 6421 and is electrically connected to the transistor TF2. The active region OD1 can serve as the second terminal of the fuse element 6421 and is electrically connected to the transistor TG1.

Figure 6B:
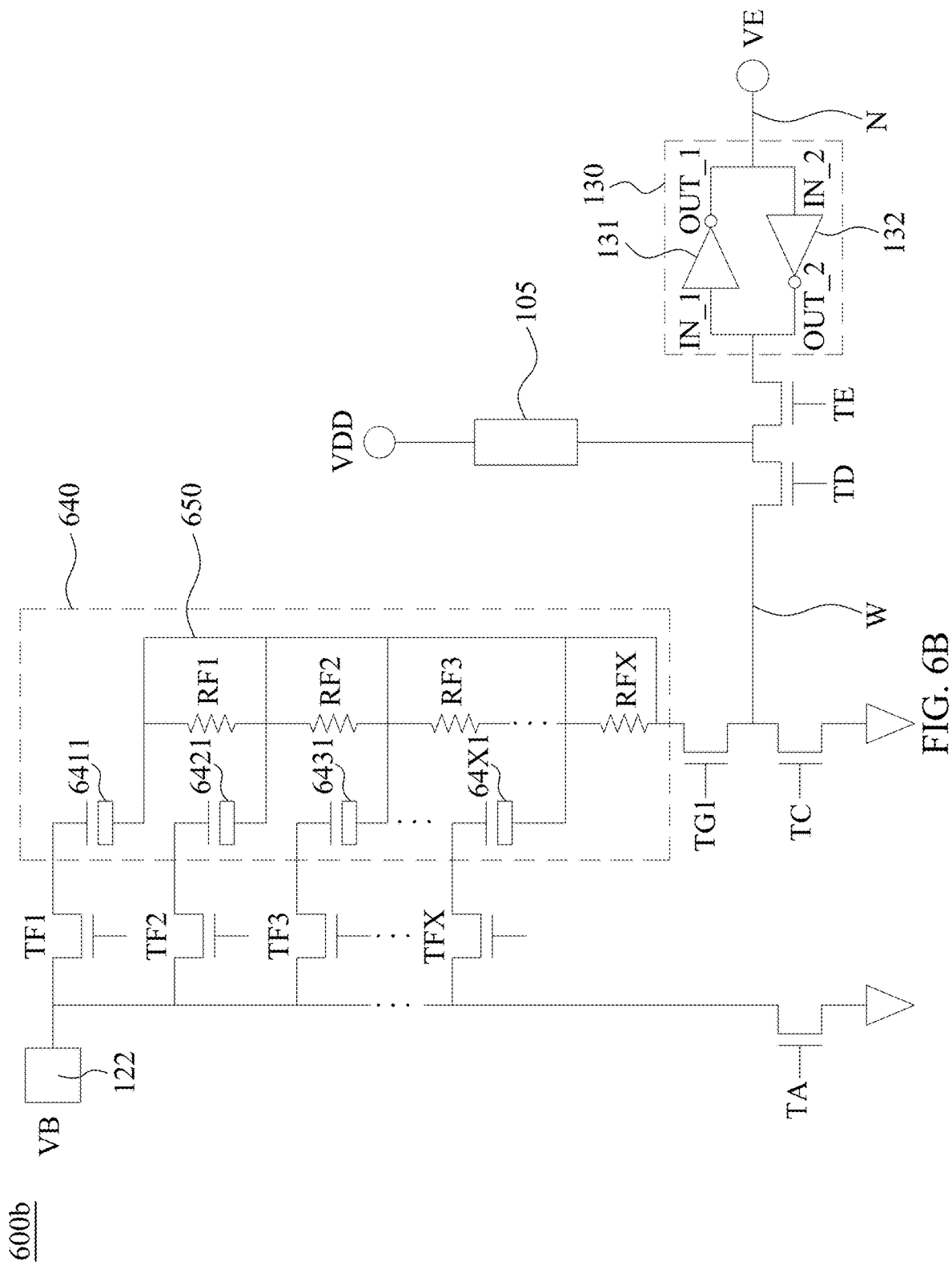
FIG. 6B is a schematic diagram of a semiconductor device structure, in accordance with some embodiments of the present disclosure.
Figure 6C:
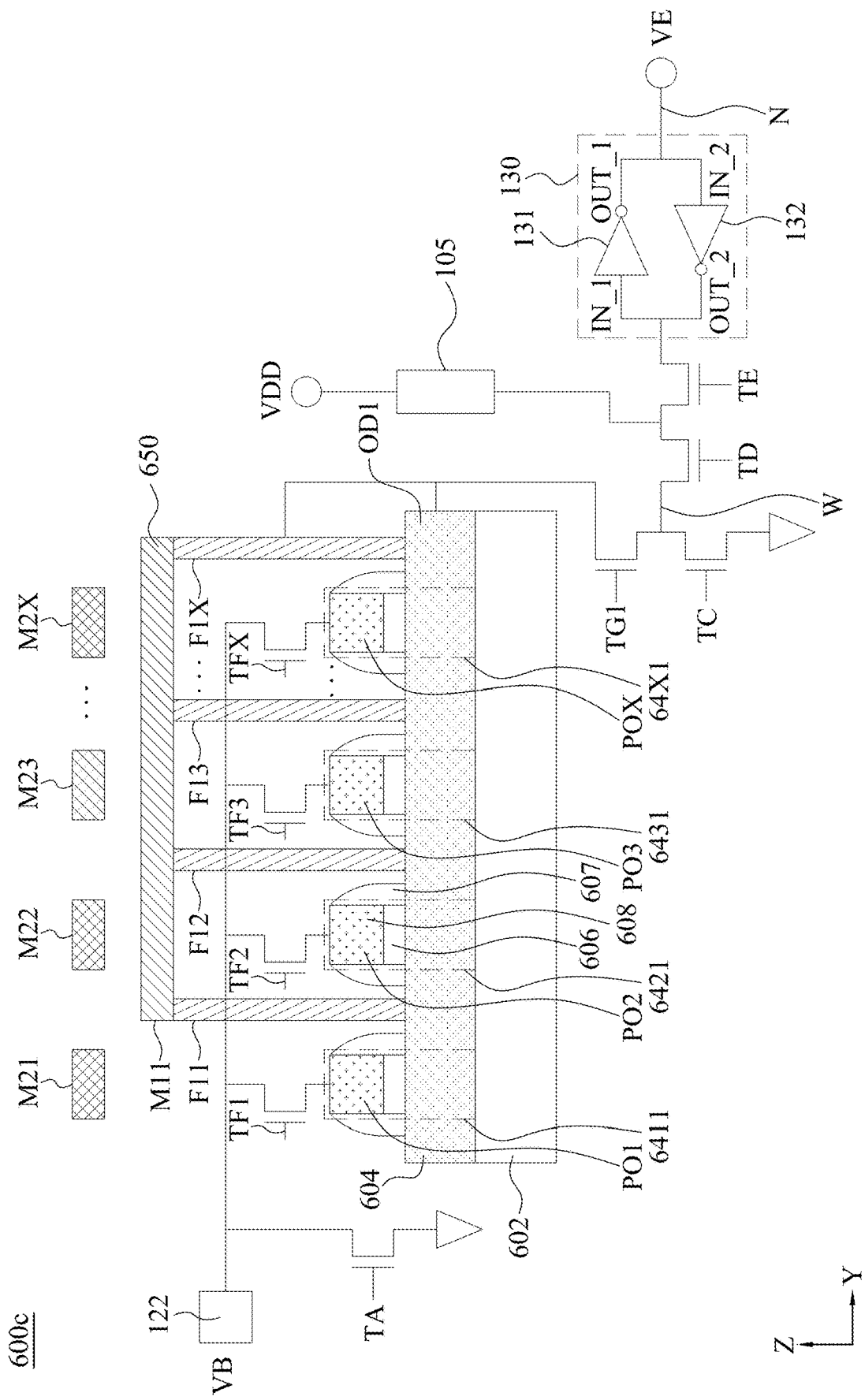
FIG. 6C is a cross-section of a semiconductor device structure along line A-A' in FIG. 4, in accordance with some embodiments of the present disclosure.

In some embodiments, the fuse structure 640 may include conductive elements (such as conductive elements M11 in FIG. 5) and contacts (such as contacts F11-F1X in FIG. 5), which are not depicted in FIG. 6A for brevity and detailed description thereof can be found in FIG. 6C.

FIG. 6B is a schematic diagram of a semiconductor device structure 600b, in accordance with some embodiments of the present disclosure. The semiconductor device structure 600b illustrates the equivalent circuit of the semiconductor device structure 600a in FIG. 6A.

The semiconductor device structure 600b can include a fuse structure 640. The fuse structure 640 can include a plurality of fuse elements 6411, 6421, 6431, ..., and 64X1. In some embodiments, the fuse elements of the fuse structure 640 can form a 1×n array. The fuse structure 640 can include the fuse elements 6411, 6421, 6431, ..., and 64X1 forming the first column.

In some embodiments, each of the first terminal of the fuse elements 6411-64X1 can be electrically connected to one of the corresponding transistors TF1-TFX, respectively. In some embodiments, each of the second terminal of the fuse elements 6411-64X1 can be electrically connected to the transistor TG1.

Referring to FIG. 6A, the active region OD1 can serve as the second terminal of the fuse element 1412 and is electrically connected to the transistor TG2. The fuse elements 6411-64X1 can share the active region OD1. In this arrangement, when the transistor TF1 and TG1 are turned on to establish a conductive path through the fuse element 6411, i.e., the conductive path through the gate structure PO1 and the active region OD1. Since the size of the active region OD1 is greater than the normal fuse element (i.e., only one fuse element), the remaining portion of the active region OD1 may exhibit a resistance between the second terminal of the fuse element 6411 and the transistor TG1. Similarly, when each of the fuse elements 6411-64X1 has a conductive path passing therethrough, the corresponding remaining portion of the active region OD1 may exhibit a resistance between the second terminal thereof and the transistor TG1.

Referring back to FIG. 6B, a resistance can occur between the second terminal of two adjacent fuse elements. For example, a resistance RF1 can occur between the second terminal of the fuse element 6411 and the fuse element 6421. A resistance RF2 can occur between the second terminal of the fuse element 6421 and the fuse element 6431. A resistance RF3 can occur between the second terminal of the fuse element 6431 and the fuse element 6441 (not shown). In some embodiments, a resistance RFX can occur between the second terminal of the fuse element 64X1 and the transistor TG1. In some embodiments, the resistance RF1, RF2, RF3, ..., and RFX can have the same resistance value. In another embodiment, the resistance RF1, RF2, RF3, ..., and RFX can have different resistance values according to the structural difference.

In some embodiments, when each of the fuse elements 6411-64X1 has a conductive path passing therethrough, the corresponding remaining portion of the active region OD1 may exhibit a resistance, in a range of RFX to a sum of RF1, RF2, ..., and RFX, between the second terminal thereof and the transistor TG1. In some embodiments, since the remaining portion of the active region OD1 for the fuse element 6411 can be greater than other fuse elements, the resistance between the second terminal of the fuse element 6411 and the transistor TG1 can be greater than others. For example, the resistance between the fuse element 6411 and the transistor TG1 can be RF1+RF2+RF3+ . . . +RFX. In some embodiments, when the conductive path passes through the fuse element 6421, the resistance between the fuse element 6421 and the transistor TG1 can be RF2+RF3+ . . . +RFX. In some embodiments, when the conductive path passes through the fuse element 6431, the resistance between the fuse element 6431 and the transistor TG1 can be RF3+ . . . +RFX. When the conductive path passes through the fuse element 64X1, the resistance between the fuse element 64X1 and the transistor TG1 can be RFX. Accordingly, the fuse element nearer the transistor TG1 may have less resistance when the resistance RF1, RF2, RF3, ..., and RFX have the same value.

The fuse structure 640 can include a conductive line 650. The conductive line 650 can be electrically connected to the second terminal of the fuse elements 6411-64X1. In some embodiments, the conductive line 650 can be referred to as the conductive element M11 in FIG. 5. In some embodiments, the conductive line 650 can connected to the resistances RF1, RF2, RF3, ..., and RFX. The conductive line 650 can be connected to the active region OD1, such that a short circuit between the active region OD1 and the transistor TG1 can be formed. For example, the resistances RF1-RFX between the active region OD1 and the transistor TG1 can be decreased. Accordingly, the conductive line 650 can connect the second terminal of the fuse elements 6411-64X1 to the transistor TG1.

The conductive line 650 can include a metal material. In some embodiments, the resistance of the conductive line 650 between the fuse elements 6411-64X1 and the transistor TG1 can be less than the resistance of the active region OD1 between the fuse elements 6411-64X1 and the transistor TG1.

In some embodiments, when the transistors TF1 and TG1 are turned on, the conductive path can pass through the fuse element 6411 and the conductive line 650, but not through the resistance RF1-RFX. When the transistors TF2 and TG1 are turned on, the conductive path can pass through the fuse element 6421 and the conductive line 650, but not through the resistance RF2-RFX. When the transistors TF3 and TG1 are turned on, the conductive path can pass through the fuse element 6431 and the conductive line 650, but not through the resistance RF3-RFX. When the transistors TFX and TG1 are turned on, the conductive path can pass through the fuse element 64X1 and the conductive line 650, but not through the resistance RFX.

In current practice, the resistance RF1, RF2, RF3, . . . , and RFX may affect the result of blowing the fuse element. With the resistance RF1-RFX within the active area OD1, the status-setting signal VB for blowing the fuse elements 6411-64X1 may be lower. The greater resistance within the active area OD1 is, the lower status-setting signal VB can be applied on the fuse element. When the status-setting signal VB is insufficient, the resistance of the blown fuse element can be different from the preferred blown resistance value. Therefore, the inaccurate blown resistance of the fuse element may lead to inaccurate test results when determining whether the corresponding semiconductor device is redundant. According to the present disclosure, including the conductive line 650, the resistance RF1-RFX between the active region OD1 and the transistor TG1 can be decreased. Therefore, the fuse elements 6411-64X1 can be blown and tested accurately. Meanwhile, the fuse structure 640 can still have the advantage of the array of fuse elements sharing the evaluating unit and status-blowing unit. Overall, the subject disclosure provides a semiconductor device with reduced area providing accurate testing results.

FIG. 6C is a cross-section of a semiconductor device structure 600c along line A-A' in FIG. 4, in accordance with some embodiments of the present disclosure.

In some embodiments, the semiconductor device structure 600c is a cross-section of the first column of the semiconductor device structure 500, having an n×n array of fuse elements, in FIG. 5. In some embodiments, the semiconductor device structure 600c illustrates the cross-section of the semiconductor device 600a, having a 1×n array of fuse elements, in FIG. 6A.

As shown in FIG. 6C, the semiconductor device structure 600c can include a substrate 602, a doped region 604, a gate dielectric layer 606, a gate electrode 608, and a spacer 607.

The substrate 602 may be a semiconductor substrate, such as a bulk semiconductor, a semiconductor-on-insulator (SOI) substrate, or the like. The substrate 602 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 602 may have a multilayer structure, or the substrate 602 may include a multilayer compound semiconductor structure.

The doped region 604 can be disposed within the substrate 602. In some embodiments, the doped region 604 can be a semiconductor material doped with dopants. The dopants can include p-type and/or n-type dopants. In some embodiments, p-type dopants can include boron (B), other group III elements, or any combination thereof. In some embodiments, n-type dopants can include arsenic (As), phosphorus (P), other group V elements, or any combination thereof. In some embodiments, the doped region 604 can define the active region OD1-ODX.

The gate dielectric layer 606 can be disposed on the substrate 602 and over the doped region 604. The gate dielectric layer 606 can have a single layer or multilayered structure. In some embodiments, the gate dielectric layer 606 can include dielectric material such as silicon oxide, silicon nitride, silicon oxynitride, other dielectric materials, or a combination thereof. In some embodiments, the gate dielectric layer 606 is a multilayered structure that includes an interfacial layer and a high-k (dielectric constant greater than 4) dielectric layer. The interfacial layer can include dielectric material such as silicon oxide, silicon nitride, silicon oxynitride, other dielectric materials, or a combination thereof. The high-k dielectric layer can include high-k dielectric material such as $HfO_2$, HfSiO, HfSiON, HfTaO, HfTiO, HfZrO, other suitable high-k dielectric materials, or a combination thereof. In some embodiments, the high-k dielectric material can further be selected from metal oxides, metal nitrides, metal silicates, transition metal-oxides, transition metal-nitrides, transition-metal silicates, metal oxynitrides, metal aluminates, and combinations thereof.

The gate electrode 608 is disposed on the gate dielectric layer 606. The gate electrode 608 can include polysilicon, silicon-germanium, and at least one metallic material including elements and compounds such as Mo, Cu, W, Ti, Ta, TiN, TaN, NiSi, CoSi, or other suitable conductive materials known in the art. In some embodiments, the gate electrode 608 includes a work function metal layer that provides a metal gate with an n-type-metal work function or a p-type-metal work function. The p-type-metal work function materials include materials such as ruthenium, palladium, platinum, cobalt, nickel, conductive metal oxide, or other suitable materials. The n-type-metal work function materials include materials such as hafnium zirconium, titanium, tantalum, aluminum, metal carbides (e.g., hafnium carbide, zirconium carbide, titanium carbide, and aluminum carbide), aluminides, or other suitable materials. The gate dielectric layer 606 and the gate electrode 608 can collaboratively define the gate structures PO1-POX.

The spacer 607 can be disposed on the substrate 602 and on two opposite sides of the gate electrode 608. The spacer 607 can include dielectric materials, such as oxide, nitride, oxynitride, and other dielectric materials. In some embodiments, the spacer 607 can include a multilayered structure, such as an oxide-nitride-oxide structure. Each of the gate structures PO1-POX can be spaced apart from each other by the spacer 607 and by other dielectric structures (not shown) filled between the spacers 607.

As shown in FIG. 6C, the transistor TG1 has a first terminal electrically connected to the active region OD1 and a second terminal electrically connected to the switching circuit TD. Each of the transistors TF1-TFX has a first terminal electrically connected to a corresponding gate structure PO1-POX and a second terminal electrically connected to the switching circuit TA.

As shown in FIG. 6C, each of the fuse elements (e.g., the fuse elements 6411-64X1) can be defined by an overlapping portion along the Z-axis of the active region (e.g., the active region OD1), the gate dielectric layer 606 and the gate electrode 608.

Although not shown in FIG. 6C, it is contemplated that some conductive traces or conductive vias (not shown) can be electrically connected between the gate electrode 608 and the transistors TF1-TFX. Similarly, some conductive traces or conductive vias (not shown) can be electrically connected between the doped region 604 and the transistors TG1-TGX.

The conductive line 650 can include the conductive element M11 and the contacts F11, F12, F13, . . . , and F1X. In some embodiments, the conductive element M11 can be disposed on the active region OD1 and across the gate structures PO2, PO3, . . . , and POX. The conductive element M11 can be shorter than the active region OD1. In some embodiments, the conductive element M11 can be equal to or greater than the active region OD1. The conductive element M11 can be surrounded by a dielectric layer/isolation layer (not shown).

The conductive element M11 can be electrically connected to the active region OD1. In some embodiments, the conductive element M11 can be electrically connected to the active region OD1 through one or more of the contacts F11, F12, . . . , and F1X. The contacts F11-F1X can be disposed on the active region OD1. The contact F11-F1X can be disposed between the conductive element M11 and the active region OD1.

Each of contacts F11-F1X is disposed adjacent to one of the gate structures PO1-POX. For example, the contact Fit can be disposed adjacent to the gate structure PO1. In some embodiments, the contact F11 can be disposed between the gate structures PO1 and PO2. The contact F12 can be disposed adjacent to the gate structure PO2. In some embodiments, the contact F12 can be disposed between the gate structures PO2 and PO3 (not shown). The contact F1X can be disposed adjacent to the gate structure POX. In some embodiments, the contact F1X can be disposed adjacent to an edge of the active region OD1. The contact F1X can be connected to the transistor TG1.

In some embodiments, the contact F11 can have a projection on the active region OD1 between a projection of the gate structure PO1 on the active region OD1 and a projection of the gate structure PO2 on the active region OD1. The contact F12 can have a projection on the active region OD1 between a projection of the gate structure PO2 on the active region OD1 and a projection of the gate structure PO3 on the active region OD1. The contact F1X can have a projection on the active region OD1 between a projection of the gate structure POX-1 (not shown) on the active region OD1 and a projection of the gate structure POX on the active region OD1.

When the transistors TF1 and TG1 are turned on, the conductive path can pass through the gate structure PO1, the active region OD1, the contact F11, and the conductive element M11. When the transistors TF2 and TG1 are turned on, the conductive path can pass through the gate structure PG2, the active region OD1, the contact F12, and the conductive element M11. When the transistors TFX and TG1 are turned on, the conductive path can pass through the gate structure POX, the active region OD1, and the contact F1X.

In some embodiments, the conductive elements M21, M22, M23, . . . , M2X can be disposed on the conductive element M11. The conductive elements M21, M22, M23, . . . , M2X can be disposed on the gate structures PO1-POX. In some embodiments, the conductive elements M21-M2X can be aligned with the gate structures PO1-POX. The conductive elements M21-M2X can be electrically connected to the gate structures PO1-POX through the contacts G11-GXX.

Figure 7A:
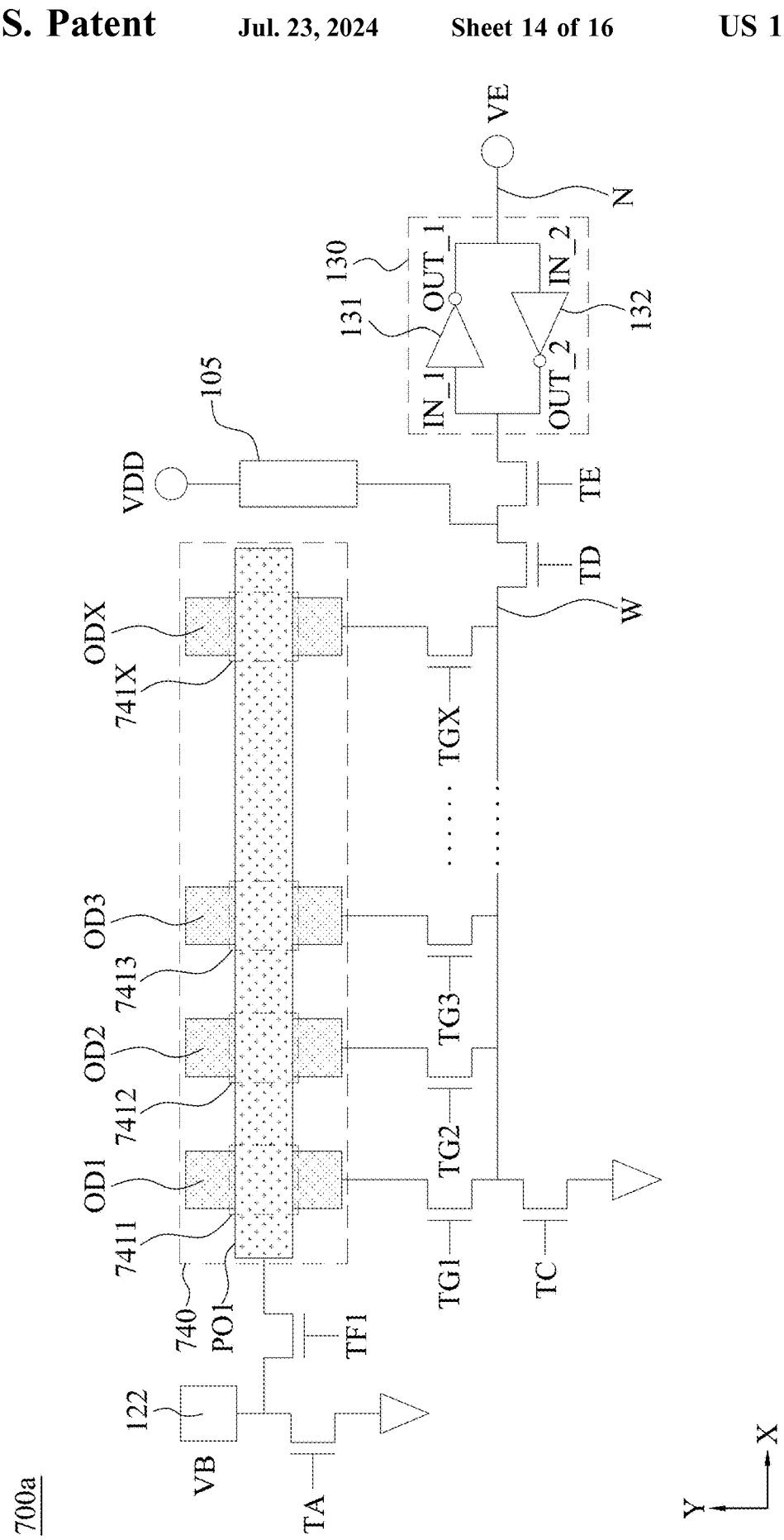
FIG. 7A is a schematic diagram of a layout of fuse elements of a semiconductor device structure, in accordance with some embodiments of the present disclosure.

FIG. 7A is a schematic diagram of a layout of fuse elements of a semiconductor device structure 700a, in accordance with some embodiments of the present disclosure. The semiconductor device structure 700a is similar to the semiconductor device 100b in FIG. 4, differing therefrom in that the fuse structure 740 includes one row of fuse elements.

The fuse structure 740 includes a gate structure PO1 extending along the X-axis. The fuse structure 740 includes a plurality of active regions OD1, OD2, . . . , and ODX extending along the Y-axis. The gate structure PO1 can cross the active regions OD1-ODX. The gate structure PO1 and one of the active regions OD1-ODX can collaboratively form or define a fuse element. For example, the gate structure PO1 can overlap the active region OD1, and thus the overlapping area of the gate structure PO1 and the active region OD1 can define the fuse element 7411. Similarly, the gate structure PO1 and the active region OD2 can define a fuse element 7412. The gate structure PO1 and the active region OD3 can define a fuse element 7413. The gate structure PO1 and the active region ODX can define a fuse element 741X.

In some embodiments, each of the active regions OD1-ODX can serve as the second terminal of one of the fuse elements 7411-741X. In some embodiments, each of the active regions OD1-ODX can be electrically connected to one of the corresponding transistors TG1-TGX, respectively. In some embodiments, the gate structure PO1 can serve as the first terminal of the fuse elements 7411-741X. In some embodiments, the gate structure PO1 can be electrically connected to the transistor TF1. For example, the gate structure PO1 can serve as the first terminal of the fuse element 7412 and is electrically connected to the transistor TF1. The active region OD2 can serve as the second terminal of the fuse element 7412 and is electrically connected to the transistor TG2.

Figure 7B:
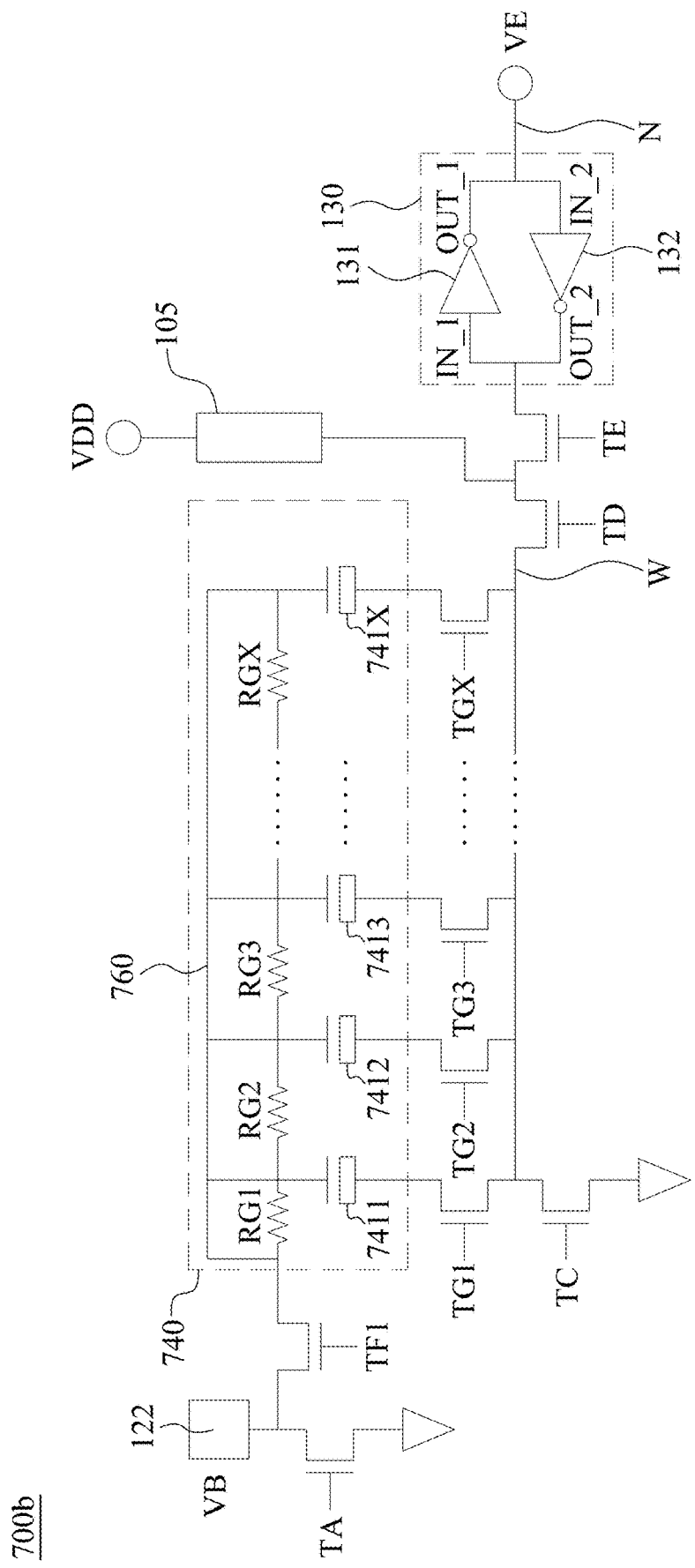
FIG. 7B is a schematic diagram of a semiconductor device structure shown in FIG. 7A, in accordance with some embodiments of the present disclosure.
Figure 7C:
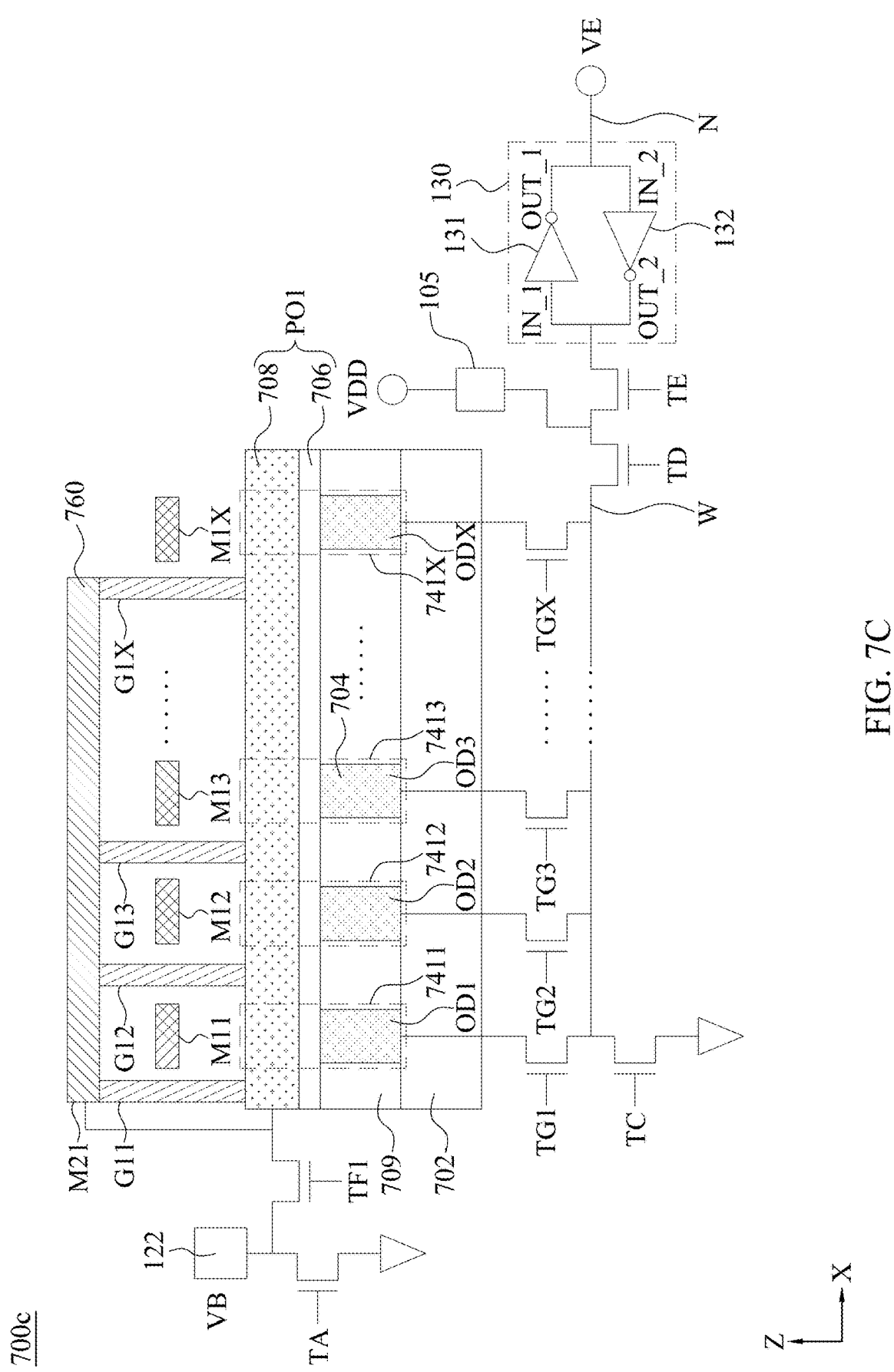
FIG. 7C is a cross-section of a semiconductor device structure along the line B-B' in FIG. 4, in accordance with some embodiments of the present disclosure.

In some embodiments, the fuse structure 740 may include conductive elements (such as conductive elements M21 in FIG. 5) and contacts (such as contacts G11-G1X in FIG. 5), which are not depicted in FIG. 7A for brevity and detailed description thereof can be found in FIG. 7C.

FIG. 7B is a schematic diagram of a semiconductor device structure 700b, in accordance with some embodiments of the present disclosure. The semiconductor device structure 700b illustrates the equivalent circuit of the semiconductor device structure 700a in FIG. 7A.

The semiconductor device structure 700b can include a fuse structure 740. The fuse structure 740 can include a plurality of fuse elements 7411, 7412, 7413, . . . , and 741X. In some embodiments, the fuse elements of the fuse structure 740 can form an n×1 array. The fuse structure 740 can include the fuse elements 7411, 7412, 7413, . . . , and 741X forming the first row.

In some embodiments, each of the second terminals of the fuse elements 7411-741X can be electrically connected to one of the corresponding transistors TG1-TGX, respectively. In some embodiments, each of the second terminals of the fuse elements 7411-741X can be electrically connected to the transistor TF1.

Referring to FIG. 7A, the gate structure PO1 can serve as the first terminal of the fuse element 1412 and is electrically connected to the transistor TF1. The fuse elements 7411-741X can share the gate structure PO1. In this arrangement, the transistors TF1 and TG1 are turned on to establish a conductive path through the fuse element 7411, i.e., the conductive path passing through the gate structure PO1 and the active region OD1. Since the size of the gate structure PO1 is greater than the normal fuse element (i.e., only one fuse element), the remaining portion of the gate structure PO1 may exhibit a resistance between the first terminal of the fuse element 7411 and the transistor TF1. Similarly, when each of the fuse elements 7411-741X has a conductive path passing therethrough, the corresponding remaining portion of the gate structure PO1 may exhibit a resistance between the first terminal thereof and the transistor TF1.

Referring back to FIG. 7B, a resistance can occur between the first terminals of two adjacent fuse elements. For example, a resistance RG2 can occur between the first terminal of the fuse element 7411 and the fuse element 7412. A resistance RG3 can occur between the first terminal of the fuse element 7412 and the fuse element 7413. A resistance RGX can occur between the first terminal of the fuse element 741X-1 (not shown) and the fuse element 741X. In some embodiments, a resistance RG1 can occur between the first terminal of the fuse element 7411 and the transistor TF1. In some embodiments, the resistance RG1, RG2, RG3, . . . , and RGX can have the same resistance value. In another embodiment, the resistance RG1, RG2, RG3, . . . , and RGX can have different resistance values according to the structural difference of the gate structure PO1.

In some embodiments, when each of the fuse elements 7411-741X has a conductive path passing therethrough, the corresponding remaining portion of the gate structure PO1 may exhibit a resistance, in a range of RG1 to a sum of RG1, RG2, . . . , and RGX, between the first terminal thereof and the transistor TF1. In some embodiments, since the remaining portion of the gate structure PO1 for the fuse element 741X can be greater than other fuse elements, the resistance between the first terminal of the fuse element 741X and the transistor TF1 can be greater than others. For example, the resistance between the fuse element 741X and the transistor TF1 can be RG1+RG2+RG3+ . . . +RGX. In some embodiments, when the conductive path passes through the fuse element 7411, the resistance between the fuse element 7411 and the transistor TF1 can be RG1. In some embodiments, when the conductive path passes through the fuse element 7412, the resistance between the fuse element 7412 and the transistor TF1 can be RG1+RG2. In some embodiments, when the conductive path passes through the fuse element 7413, the resistance between the fuse element 7413 and the transistor TF1 can be RG1+RG2+RG3. Accordingly, the fuse element nearer the transistor TF1 may have less resistance when the resistance RG1, RG2, RG3, . . . , and RGX have the same value.

The fuse structure 740 can include a conductive line 760. The conductive line 760 can be electrically connected the first terminal of the fuse elements 7411-741X. In some embodiments, the conductive line 760 can be referred to as the conductive element M21 in FIG. 5. In some embodiments, the conductive line 760 can be connected to the resistances RG1, RG2, RG3, . . . , and RGX. The conductive line 760 can be connected to the gate structure PO1, such that a short circuit between the gate structure PO1 and the transistor TF1 can be formed. For example, the resistances RG1-RGX between the gate structure PO1 and the transistor TF1 can be decreased. Accordingly, the conductive line 760 can connect the first terminal of the fuse elements 7411-741X to the transistor TF1.

The conductive line 760 can include a metal material. In some embodiments, the resistance of the conductive line 760 between the fuse elements 7411-741X and the transistor TF1 can be less than the resistance of the gate structure PO1 between the fuse elements 7411-741X and the transistor TF1.

In some embodiments, when the transistors TF1 and TG1 are turned on, the conductive path can pass through the fuse element 7411 and the conductive line 760, but not through the resistance RG1. When the transistors TF1 and TG2 are turned on, the conductive path can pass through the fuse element 7412 and the conductive line 760, but not through the resistance RG1 and RG2. When the transistors TF1 and TG3 are turned on, the conductive path can pass through the fuse element 7413 and the conductive line 760, but not through the resistance RG1-RG3. When the transistors TF1 and TGX are turned on, the conductive path can pass through the fuse element 741X and the conductive line 760, but not through the resistance RG1-RGX.

In current practice, resistances RG1, RG2, RG3, . . . , and RGX may affect the result of blowing the fuse element. With the resistance RG1-RGX within the gate structure PO1, the status-setting signal VB for blowing the fuse elements 7411-741X may be lower. The greater resistance within the gate structure PO1 is, the lower status-setting signal VB may be applied on the fuse elements. When the status-setting signal VB is insufficient, the resistance of the blown fuse element can be different from the preferred blown resistance value. Therefore, the inaccurate blown resistance of the fuse element may lead to inaccurate test result for determining whether the corresponding semiconductor device is redundant. According to the present disclosure, including the conductive line 760, the resistance RG1-RGX between the transistor TF1 and the gate structure PO1 can be decreased. Therefore, the fuse elements 7411-741X can be blown and tested accurately. Meanwhile, the fuse structure 740 can still have the advantage of the array of fuse elements sharing the evaluating unit and status-blowing unit. Overall, the subject disclosure provides a semiconductor device with reduced area providing accurate testing results.

FIG. 7C is a cross-section of a semiconductor device structure 700c along the line B-B' in FIG. 4, in accordance with some embodiments of the present disclosure.

In some embodiments, the semiconductor device structure 700c is a cross-section of the first row of the semiconductor device structure 500, having an n×n array of fuse elements, in FIG. 5. In some embodiments, the semiconductor device structure 700c illustrates a cross-section of the semiconductor device 700a, having a 1×n array of fuse elements, in FIG. 7A.

As shown in FIG. 7C, the semiconductor device structure 700c can include a substrate 702, a doped region 704, a gate dielectric layer 706, a gate electrode 708, and an isolation feature 709. The substrate 702, the doped region 704, the gate dielectric layer 706, and the gate electrode 708 can be referred to as the corresponding elements described in FIG.

6C, and thus detailed descriptions thereof are omitted for brevity. In some embodiments, the semiconductor device structure 700c can include a spacer (not shown), which can be referred to as the spacer 607 in FIG. 6C.

As shown in FIG. 7C, the semiconductor device structure 700c can include isolation features 709 separating the plurality of active regions OD1-ODX from each other. In some embodiments, the isolation feature 709 can be a shallow trench isolation (STI) and be embedded in the substrate 702. The isolation feature 709 can include dielectric materials, such as oxide, nitride, oxynitride, and other dielectric materials.

As shown in FIG. 7C, the gate structure PO1, including the gate dielectric layer 706 and the gate electrode 708, can be disposed on the plurality of active regions OD1-ODX. The transistor TF1 has a first terminal electrically connected to the gate structure PO1 and a second terminal electrically connected to the switching circuit TA. Each of the transistors TG1-TGX has a first terminal electrically connected to a corresponding active region OD1-ODX and a second terminal electrically connected to the switching circuit TD.

As shown in FIG. 7C, each of the fuse elements (e.g., the fuse elements 7411-741X) can be defined by an overlapping portion along the Z-axis of the gate dielectric layer 706, the gate electrode 708 (i.e., the gate structure PO1), and doped region 704 (such as the active region OD3).

The conductive line 760 can include the conductive element M21 and the contacts G11, G12, G13, . . . , and G1X. In some embodiments, the conductive element M21 can be disposed on the gate structure PO1 and across the active regions OD1-ODX. The conductive element M21 can be shorter than the gate structure PO1. In some embodiments, the width of the conductive element M21 can be equal to or greater than that of the gate structure PO1. The conductive element M21 can be surrounded within a dielectric layer/isolation layer (not shown).

The conductive element M21 can be electrically connected to the gate structure PO1. In some embodiments, the conductive element M21 can be electrically connected to the gate structure PO1 through one or more of the contacts G11, G12, . . . , and G1X. The contacts G11-G1X can be disposed on the gate structure PO1. The contact G11-G1X can be disposed between the conductive element M21 and the gate structure PO1.

In some embodiments, the contact G11 can have a projection on the gate structure PO1 adjacent to a projection of the active region OD1 on the gate structure PO1. The contact G12 can have a projection on the gate structure PO1 adjacent to a projection of the active region OD2 on the gate structure PO1. The contact G1X can have a projection on the gate structure PO1 adjacent to a projection of the active region ODX on the gate structure PO1.

In some embodiments, the contact G11 can be disposed adjacent to an edge of the gate structure PO1. The contact G12 can have a projection on the gate structure PO1 between a projection of the active regions OD1 and OD2 on the gate structure PO1. The contact G13 can have a projection on the gate structure PO1 between a projection of the active regions OD2 and OD3 on the gate structure PO1. The contact G1X can have a projection on the gate structure PO1 between a projection of the active regions ODX-1 (not shown) and ODX on the gate structure PO1.

When the transistors TF1 and TG1 are turned on, the conductive path to the ground can pass through the conductive element M21, the contact G11, the gate structure PO1, and the active region OD1. When the transistors TF1 and TG2 are turned on, the conductive path to the ground can pass through the conductive element M21, the contact G12, the gate structure PO1, and the active region OD2. When the transistors TF1 and TGX are turned on, the conductive path can pass through the conductive element M21, the contact G1X, the gate structure PO1, and the active region ODX.

One aspect of the present disclosure provides a semiconductor device structure. The semiconductor device structure includes a first gate structure extending along a first direction and electrically connected to a first transistor, a second gate structure extending along the first direction and electrically connected to a second transistor, a first active region extending along a second direction different from the first direction and across the first gate structure and the second gate structure, and a first conductive element extending along the second direction and disposed on the first active region. The first conductive element is electrically connected to the first active region. The first conductive element is electrically connected to the first active region, such that a short circuit between the first active region and the third transistor is formed. The first gate structure and the first active region form a first fuse element, and the second gate structure and the first active region form a second fuse element.

Another aspect of the present disclosure provides a semiconductor device structure. The semiconductor device structure includes a plurality of gate structures extending along a first direction, a plurality of active regions extending along a second direction different from the first direction, a plurality of first transistors, and a plurality of second transistors. The plurality of gate structures and the plurality of active regions define a plurality of fuse elements. Each one of the plurality of first transistors is electrically connected to a corresponding one of the plurality of gate structures. Each one of the plurality of second transistors is electrically connected to a corresponding one of the plurality of active regions. The semiconductor device structure further includes a plurality of first conductive elements disposed on the active regions and extending along the second direction. Each of the plurality of first conductive elements electrically is connected to a corresponding one of the active regions, respectively, such that a short circuit between the corresponding one of the plurality of active regions and a corresponding one of the plurality of second transistors is formed.

Another aspect of the present disclosure provides a semiconductor circuit. The semiconductor circuit includes a first fuse element, a second fuse element, a first conductive line, a reference resistor unit, a first switching circuit, and a latch circuit. The first fuse element includes a first terminal and a second terminal opposite to the first terminal. The second fuse element includes a first terminal and a second terminal opposite to the first terminal. The first conductive line is electrically connected to the second terminal of the first fuse element and the second terminal of the second fuse element. The reference resistor unit is configured to receive a first power signal and electrically connected with the first fuse element and the second fuse element. The first switching circuit is configured to electrically connect the reference resistor unit to the first fuse element and the second fuse element. The latch circuit is configured to read an evaluating signal of a first node between the reference resistor unit and one of the first fuse element and the second fuse element. The first conductive line is configured to form a short circuit between the first switching circuit and one of the first fuse element and the second fuse element.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device structure, comprising:
   a plurality of gate structures extending along a first direction;
   a plurality of active regions extending along a second direction different from the first direction, wherein the plurality of gate structures and the plurality of active regions define a plurality of fuse elements;
   a plurality of first transistors, wherein each one of the plurality of first transistors is electrically connected to a corresponding one of the plurality of gate structures;
   a plurality of second transistors, wherein each one of the plurality of second transistors is electrically connected to a corresponding one of the plurality of active regions; and
   a plurality of first conductive elements disposed on the active regions and extending along the second direction,
   wherein each of the plurality of first conductive elements is electrically connected to the corresponding one of the plurality of active regions, respectively, such that a short circuit between the corresponding one of the plurality of active regions and a corresponding one of the plurality of second transistors is formed.

2. The semiconductor device structure of claim 1, further comprising:
   a plurality of second conductive elements disposed on the gate structures, and extending along the first direction, wherein each of the second conductive elements is respectively electrically connected to a corresponding one of the plurality of gate structures,
   wherein each of the plurality of second conductive elements is electrically connected to the corresponding one of the gate structures, such that a short circuit between the corresponding one of the plurality of gate structures and a corresponding one of the plurality of first transistors is formed.

3. The semiconductor device structure of claim 1, further comprising:
   a reference resistor unit configured to receive a first power signal and electrically connected with the plurality of fuse elements;
   a first switching circuit configured to be electrically connected the reference resistor unit and the plurality of fuse elements; and
   a latch circuit configured to read an evaluating signal of a first node between the reference resistor unit and one of the plurality of fuse elements.

4. The semiconductor device structure of claim 3, wherein the plurality of fuse elements share the first switching circuit.

5. The semiconductor device structure of claim 3, further comprising:
   a second switching circuit configured to electrically connect the plurality of fuse elements to ground.

6. The semiconductor device structure of claim 5, wherein in response to the first power signal being applied to the reference resistor unit, the first switching circuit and the second switching circuit are configured to establish a first conductive path to the ground through the reference resistor unit and one of the plurality of fuse elements.

7. The semiconductor device structure of claim 6, wherein the first conductive path to the ground through the reference resistor unit, one of the plurality of fuse elements, and the one of the plurality of first conductive elements.

8. The semiconductor device structure of claim 5, wherein the plurality of fuse elements share the second switching circuit.

9. The semiconductor device structure of claim 3, further comprising:
   a first conductive terminal connected to one of the plurality of fuse elements and configured to receive a second power signal; and
   a third switching circuit connected between the first node and ground,
   wherein the third switching circuit is configured to establish a second conductive path to the ground through one of the plurality of fuse elements.

10. The semiconductor device structure of claim 9, wherein the second conductive path to the ground through one of the plurality of fuse elements and the one of the plurality of first conductive elements.

11. A semiconductor circuit, comprising:
    a first fuse element, including a first terminal and a second terminal opposite to the first terminal;
    a second fuse element, including a first terminal and a second terminal opposite to the first terminal;
    a first conductive line electrically connected to the second terminal of the first fuse element and the second terminal of the second fuse element;
    a reference resistor unit configured to receive a first power signal and electrically connected with the first fuse element and the second fuse element;
    a first switching circuit configured to electrically connect the reference resistor unit to the first fuse element and the second fuse element; and
    a latch circuit configured to read an evaluating signal of a first node between the reference resistor unit and one of the first fuse element and the second fuse element,
    wherein the first conductive line is configured to form a short circuit between the first switching circuit and one of the first fuse element and the second fuse element.

12. The semiconductor circuit of claim 11, further comprising:
    a second switching circuit configured to electrically connect the plurality of fuse elements to ground.

13. The semiconductor circuit of claim 12, wherein in response to the first power signal being applied to the first terminal of the reference resistor unit, the first switching circuit and the second switching circuit are configured to establish a first conductive path to the ground through the reference resistor unit and one of the first fuse element and the second fuse element.

14. The semiconductor circuit of claim 11, further comprising:

a first conductive terminal connected to one of the first fuse element and the second fuse element and configured to receive a second power signal; and a third switching circuit connected between the first node and ground, wherein the third switching circuit is configured to establish a second conductive path to the ground through one of the first fuse element and the second fuse element.

15. The semiconductor circuit of claim 11, further comprising:

a first gate structure extending along a first direction;

a second gate structure extending along the first direction; and a first active region extending along a second direction different from the first direction and across the first gate structure and the second gate structure, wherein the first gate structure and the first active region define the first fuse element, and wherein the second gate structure and the first active region define the second fuse element.

16. The semiconductor circuit of claim 11, further comprising:

a first transistor electrically connected to the first terminal of the first fuse element; and a second transistor electrically connected to the second terminal of the first fuse element and the first switching circuit.

* * * * *